US012769005B2

(12) United States Patent
Schleuning et al.

(10) Patent No.: US 12,769,005 B2
(45) **Date of Patent: *Oct. 20, 2026**

(54) LIGHT DETECTION AND RANGING (LIDAR) DEVICES HAVING VERTICAL-CAVITY SURFACE-EMITTING LASER (VCSEL) EMITTERS

(71) Applicant: Waymo LLC, Mountain View, CA (US)

(72) Inventors: David Schleuning, Piedmont, CA (US); James Dunphy, San Jose, CA (US); Augusto Tazzoli, San Jose, CA (US); Matthew Last, San Jose, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/731,976

(22) Filed: Jun. 3, 2024

(65) Prior Publication Data

US 2024/0319378 A1 Sep. 26, 2024

Related U.S. Application Data

(63) Continuation of application No. 17/513,973, filed on Oct. 29, 2021, now Pat. No. 12,072,422.

(Continued)

(51) Int. Cl.

*G01S 17/931* (2020.01)
*G01S 7/481* (2006.01)

(Continued)

(52) U.S. Cl.

CPC .......... *G01S 17/931* (2020.01); *G01S 7/4815* (2013.01); *H01S 5/183* (2013.01); *H01S 5/423* (2013.01)

(58) Field of Classification Search

CPC ...... G01S 17/931; G01S 7/4815; G01S 7/484; G01S 17/42; H01S 5/183; H01S 5/423; H01S 5/0428

See application file for complete search history.

(56) References Cited

U.S. PATENT DOCUMENTS 6,195,485 B1 2/2001 Coldren et al.
8,761,594 B1 6/2014 Gross et al.

(Continued)

FOREIGN PATENT DOCUMENTS

CN 104898125 A 9/2015
CN 207571298 U 7/2018

(Continued)

OTHER PUBLICATIONS

"Vertical-Cavity Surface-Emitting Laser Technology"; Princeton Optronics; retrieved from newmetals.co.jp/pdf/234.pdf (Jun. 4, 2010).

(Continued)

*Primary Examiner* — Brian A Zimmerman
*Assistant Examiner* — Cal J Eustaquio
(74) *Attorney, Agent, or Firm* — McDonnell Boehnen Hulbert & Berghoff LLP

(57) ABSTRACT

Example embodiments relate to light detection and ranging (lidar) devices having vertical-cavity surface-emitting laser (VCSEL) emitters. An example lidar device includes an array of individually addressable VCSELs configured to emit light pulses into an environment surrounding the lidar device. The lidar device also includes a firing circuit configured to selectively fire the individually addressable VCSELs in the array. In addition, the lidar device includes a controller configured to control the firing circuit using a control signal. Further, the lidar device includes a plurality of detectors. Each detector in the plurality of detectors is configured to detect reflections of light pulses that are (Continued)

emitted by one or more individually addressable VCSELs in the array and reflected by one or more objects in the environment surrounding the lidar device.

20 Claims, 25 Drawing Sheets

Related U.S. Application Data

(60) Provisional application No. 63/107,929, filed on Oct. 30, 2020.

(51) Int. Cl.
*H01S 5/183* (2006.01)
*H01S 5/42* (2006.01)

(56) References Cited

U.S. PATENT DOCUMENTS

| | | | |
|---|---|---|---|
| 9,831,630 | B2 | 11/2017 | Lipson |
| 10,027,091 | B2 | 7/2018 | Lipson |
| 10,116,115 | B2 | 10/2018 | Taylor et al. |
| 10,317,529 | B2 | 6/2019 | Shu et al. |
| 10,386,488 | B2 | 8/2019 | Ridderbusch |
| 10,444,359 | B2 | 10/2019 | Pacala et al. |
| 10,483,722 | B2 | 11/2019 | Burroughs et al. |
| 10,514,444 | B2 | 12/2019 | Donovan |
| 10,530,128 | B2 | 1/2020 | Carson et al. |
| 10,557,924 | B1 | 2/2020 | Jang et al. |
| 10,761,195 | B2 | 9/2020 | Donovan |
| 2003/0031218 | A1 | 2/2003 | Yeh |
| 2004/0033637 | A1* | 2/2004 | Johnson .................. H01S 5/183 438/483 |
| 2005/0009244 | A1 | 1/2005 | Shiobara et al. |
| 2005/0087747 | A1* | 4/2005 | Yamada ................... G02B 6/43 257/E25.032 |
| 2005/0142033 | A1* | 6/2005 | Glezer .................. B01L 3/5085 422/400 |
| 2005/0201188 | A1* | 9/2005 | Donze ...................... G11C 7/04 365/232 |
| 2008/0240185 | A1 | 10/2008 | Sai |
| 2009/0166889 | A1* | 7/2009 | Murugan ................ H01L 25/16 257/777 |
| 2013/0253487 | A1 | 9/2013 | Liu et al. |
| 2015/0234137 | A1 | 8/2015 | Kuo et al. |
| 2015/0260830 | A1 | 9/2015 | Ghosh et al. |
| 2015/0362585 | A1 | 12/2015 | Ghosh et al. |
| 2016/0072258 | A1 | 3/2016 | Seurin et al. |
| 2016/0266242 | A1 | 9/2016 | Gilliland et al. |
| 2017/0063040 | A1 | 3/2017 | Su et al. |
| 2017/0307736 | A1 | 10/2017 | Donovan |
| 2017/0353004 | A1 | 12/2017 | Chen et al. |
| 2018/0102442 | A1* | 4/2018 | Wang .................... H10F 77/147 |
| 2018/0174932 | A1* | 6/2018 | Cok ........................ H01L 22/22 |
| 2018/0301875 | A1 | 10/2018 | Burroughs et al. |
| 2020/0006920 | A1 | 1/2020 | Padullaparthi et al. |
| 2020/0028329 | A1 | 1/2020 | Gronenborn et al. |
| 2020/0169065 | A1 | 5/2020 | Carson et al. |
| 2020/0278426 | A1 | 9/2020 | Dummer et al. |
| 2020/0284883 | A1 | 9/2020 | Ferreira et al. |
| 2020/0321754 | A1 | 10/2020 | Hegblom et al. |
| 2020/0326425 | A1 | 10/2020 | Donovan et al. |
| 2021/0403023 | A1* | 12/2021 | Zhao ..................... G01S 17/931 |
| 2022/0029386 | A1* | 1/2022 | Pajkic ...................... H01S 5/183 |
| 2022/0037853 | A1* | 2/2022 | Oka ...................... H01S 5/0428 |

FOREIGN PATENT DOCUMENTS

| | | | |
|---|---|---|---|
| CN | 109387857 | A | 2/2019 |
| CN | 109856644 | A | 6/2019 |
| CN | 110412544 | A | 11/2019 |
| CN | 110596720 | A | 12/2019 |
| CN | 110707530 | A | 1/2020 |
| CN | 110710072 | A | 1/2020 |
| CN | 111048996 | A | 4/2020 |
| CN | 111224320 | A | 6/2020 |
| JP | H07503104 | A | 3/1995 |
| JP | H11087843 | A | 3/1999 |
| JP | H11340572 | A | 12/1999 |
| JP | 2016188808 | A | 11/2016 |
| JP | 2018511785 | A | 4/2018 |
| JP | 2019191109 | A | 10/2019 |
| JP | 2020064059 | A | 4/2020 |
| KR | 10-2050677 | B1 | 12/2019 |
| KR | 102164841 | B1 | 10/2020 |
| WO | 2018206517 | A1 | 5/2018 |
| WO | 2018150998 | A1 | 8/2018 |
| WO | 2019236005 | A1 | 5/2019 |
| WO | 2019211135 | A1 | 11/2019 |
| WO | 2020037552 | A1 | 2/2020 |
| WO | 2020065391 | A1 | 4/2020 |
| WO | 2020193290 | A1 | 10/2020 |
| WO | 2020210176 | A1 | 10/2020 |

OTHER PUBLICATIONS

"Low-divergence high-power VCSEL arrays for lidar application"; Mial E. Warren, et al.; Proc. SPIE 10552, Vertical-Cavity Surface-Emitting Lasers XXII, 105520E (Feb. 19, 2018).
"VCSELs to Feature in Production Vehicle Lidar from 2022"; retrieved from https://optics.org/news/11/8/16 (Aug. 11, 2020).
International Search Report and Written Opinion for International Patent Application No. PCT/US2021/057317; mailed Feb. 24, 2022 (8 Pages).

* cited by examiner

LIGHT DETECTION AND RANGING (LIDAR) DEVICES HAVING VERTICAL-CAVITY SURFACE-EMITTING LASER (VCSEL) EMITTERS

CROSS-REFERENCE TO RELATED APPLICATIONS

The present application is a continuation of U.S. application Ser. No. 17/513,973, filed Oct. 29, 2021; which claims the benefit of Provisional Pat. App. No. 63/107,929, filed Oct. 30, 2020; the contents of each of which are hereby incorporated by reference.

BACKGROUND

Unless otherwise indicated herein, the materials described in this section are not prior art to the claims in this application and are not admitted to be prior art by inclusion in this section.

Autonomous vehicles or vehicles operating in an autonomous mode may use various sensors to detect their surroundings. For example, light detection and ranging (lidar) devices, radio detection and ranging (radar) devices, and/or cameras may be used to identify objects in environments surrounding autonomous vehicles. Such sensors may be used in object detection and avoidance and/or in navigation, for example.

A lidar device can determine distances to environmental features while scanning through a scene to collect data that can be assembled into a "point cloud" indicative of reflective surfaces in the environment. Individual points in the point cloud can be determined, for example, by transmitting a laser pulse and detecting a returning pulse, if any, reflected from an object in the environment, and then determining a distance to the object according to a time delay between the transmission of the pulse and the reception of the reflected pulse. As a result, for example, a three-dimensional map of points indicative of locations of reflective features in the environment can be generated.

SUMMARY

This disclosure relates to light detection and ranging (lidar) devices that have vertical-cavity surface-emitting laser (VCSEL) emitters. The VCSEL emitters may include arrays of VCSELs used to transmit signals that are later detected by corresponding detectors of the lidar device to determine the distance to one or more objects in a surrounding environment. The VCSELs in the array may be individually addressable. Further, a lidar controller may use control signal(s) to control a firing circuit used to selectively fire one or more of the VCSELs. The individual addressability and the selective firing of the VCSELs in the array may allow for the implementation of a plurality of firing patterns. Such firing patterns could be used to mitigate cross-talk in adjacent channels (e.g., based on reflections from retroreflectors in the surrounding environment), reduce the power consumed to observe the surrounding environment, and/or enhance the resolution of a point cloud generated by the lidar device, for example.

In one aspect, a light detection and ranging (lidar) device is provided. The lidar device includes an array of individually addressable vertical-cavity surface-emitting lasers (VCSELs) configured to emit light pulses into an environment surrounding the lidar device. The lidar device also includes a firing circuit configured to selectively fire the individually addressable VCSELs in the array. In addition, the lidar device includes a controller configured to control the firing circuit using a control signal. Further, the lidar device includes a plurality of detectors. Each detector in the plurality of detectors is configured to detect reflections of light pulses that are emitted by one or more individually addressable VCSELs in the array and reflected by one or more objects in the environment surrounding the lidar device.

In another aspect, a method is provided. The method includes transmitting, from a controller of a light detection and ranging (lidar) device, a control signal to a firing circuit of the lidar device. The method also includes causing, by the firing circuit based on the control signal, an individually addressable vertical-cavity surface-emitting laser (VCSEL) to emit a light pulse into a surrounding environment of the lidar device. The individually addressable VCSEL is one of a plurality of individually addressable VCSELs within the array. In addition, the method includes detecting, by a detector of the lidar device, a reflection of the light pulse from the environment surrounding the lidar device. The detector is one of a plurality of detectors of the lidar device.

These as well as other aspects, advantages, and alternatives will become apparent to those of ordinary skill in the art by reading the following detailed description, with reference, where appropriate, to the accompanying drawings.

DETAILED DESCRIPTION

Figure 1:
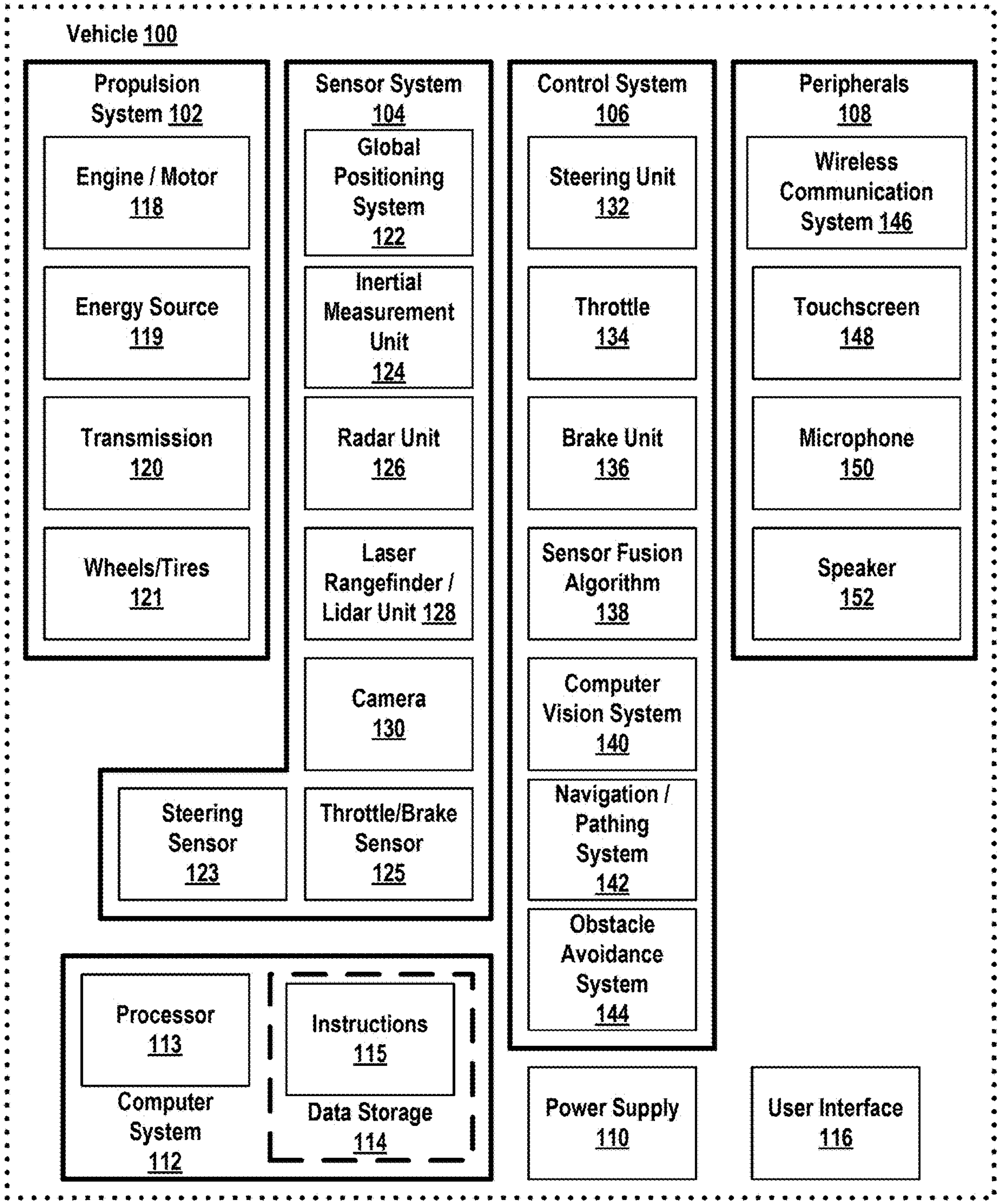
FIG. 1 is a functional block diagram illustrating a vehicle, according to example embodiments.
Figure 2A:
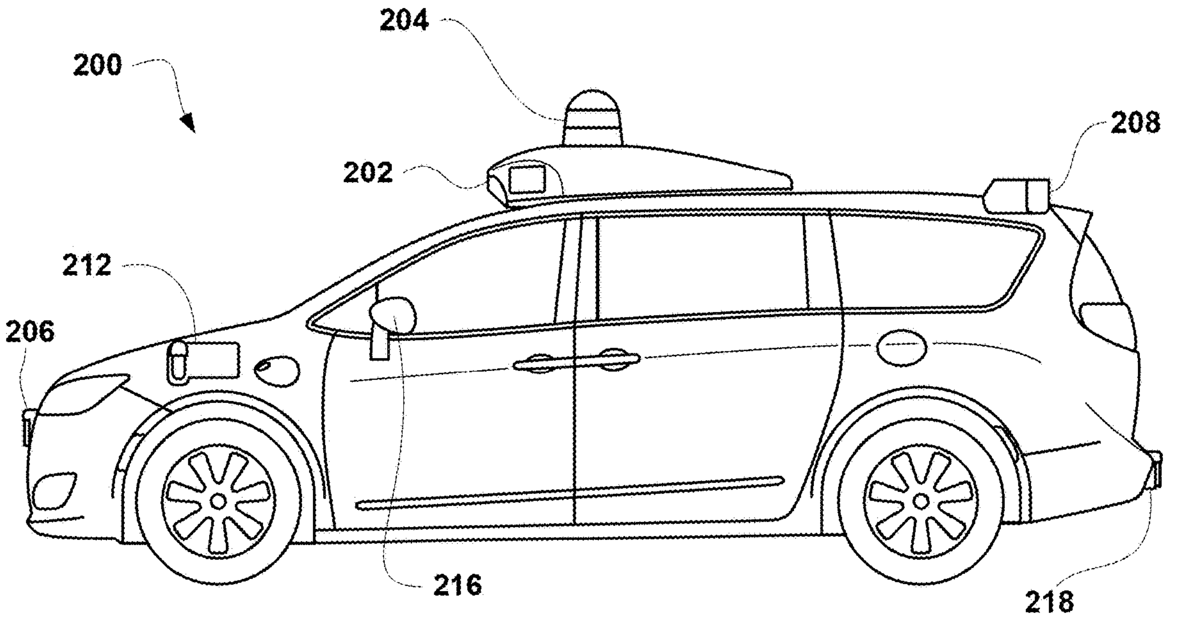
FIG. 2A is an illustration of a physical configuration of a vehicle, according to example embodiments.
Figure 2B:
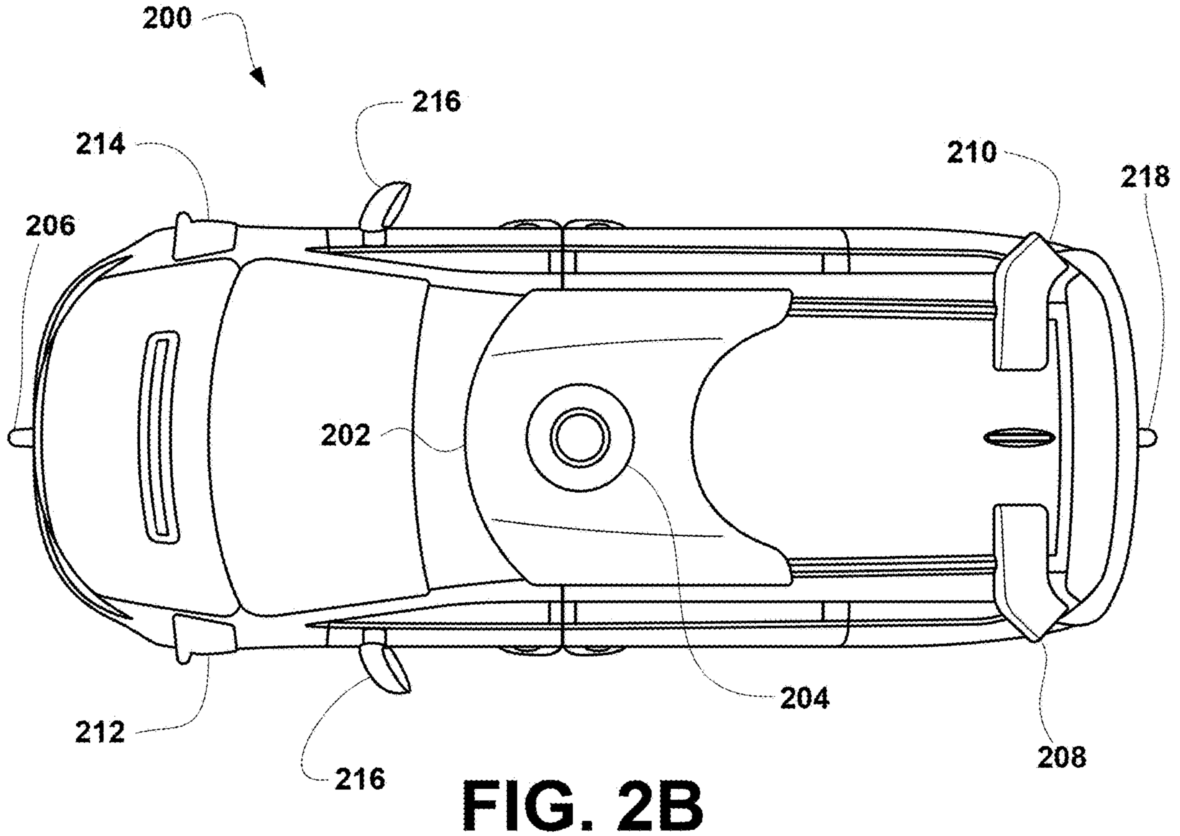
FIG. 2B is an illustration of a physical configuration of a vehicle, according to example embodiments.
Figure 2C:
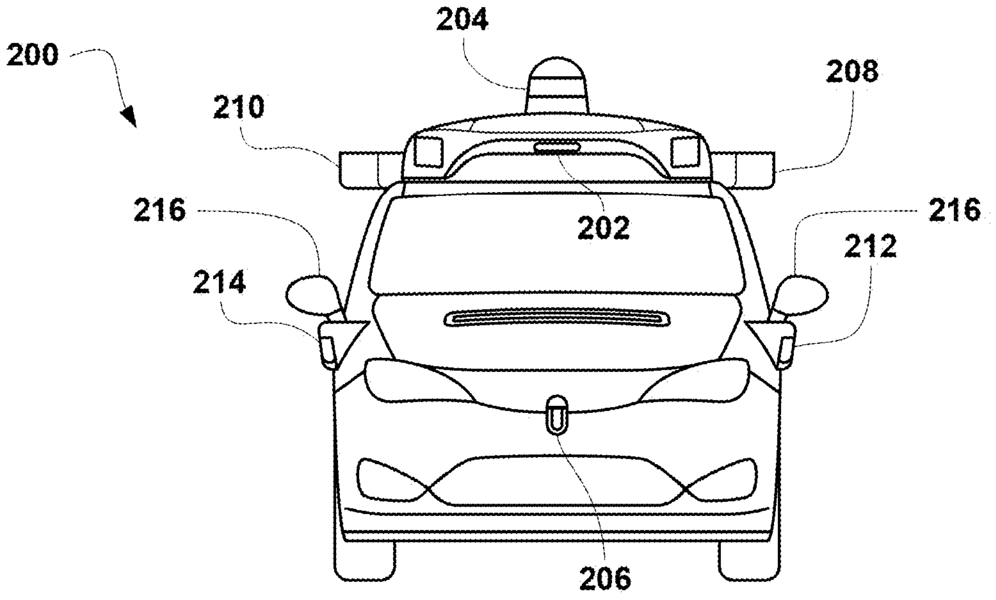
FIG. 2C is an illustration of a physical configuration of a vehicle, according to example embodiments.
Figure 2D:
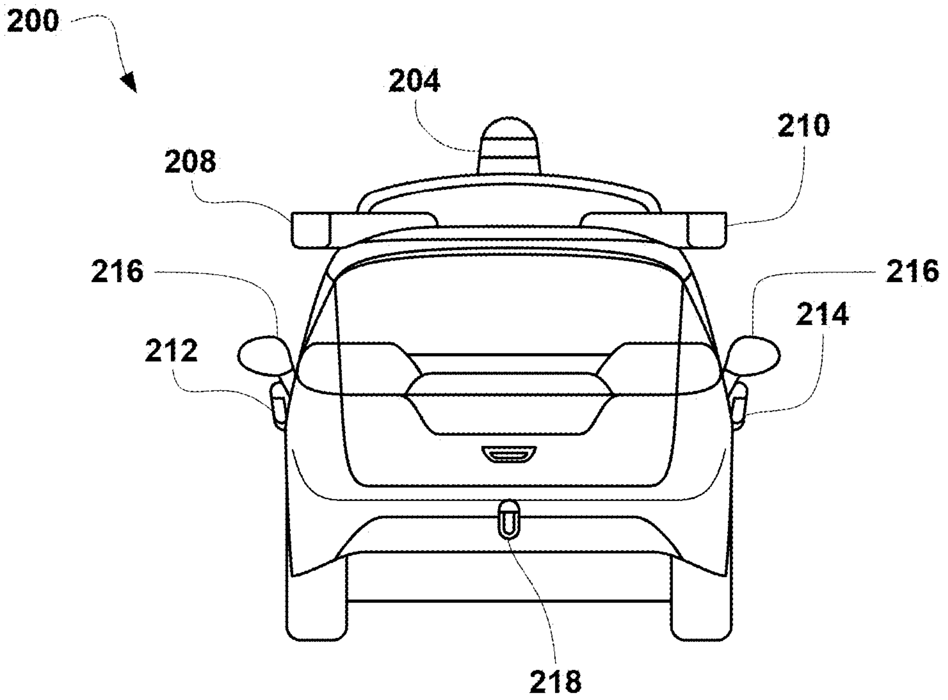
FIG. 2D is an illustration of a physical configuration of a vehicle, according to example embodiments.
Figure 2E:
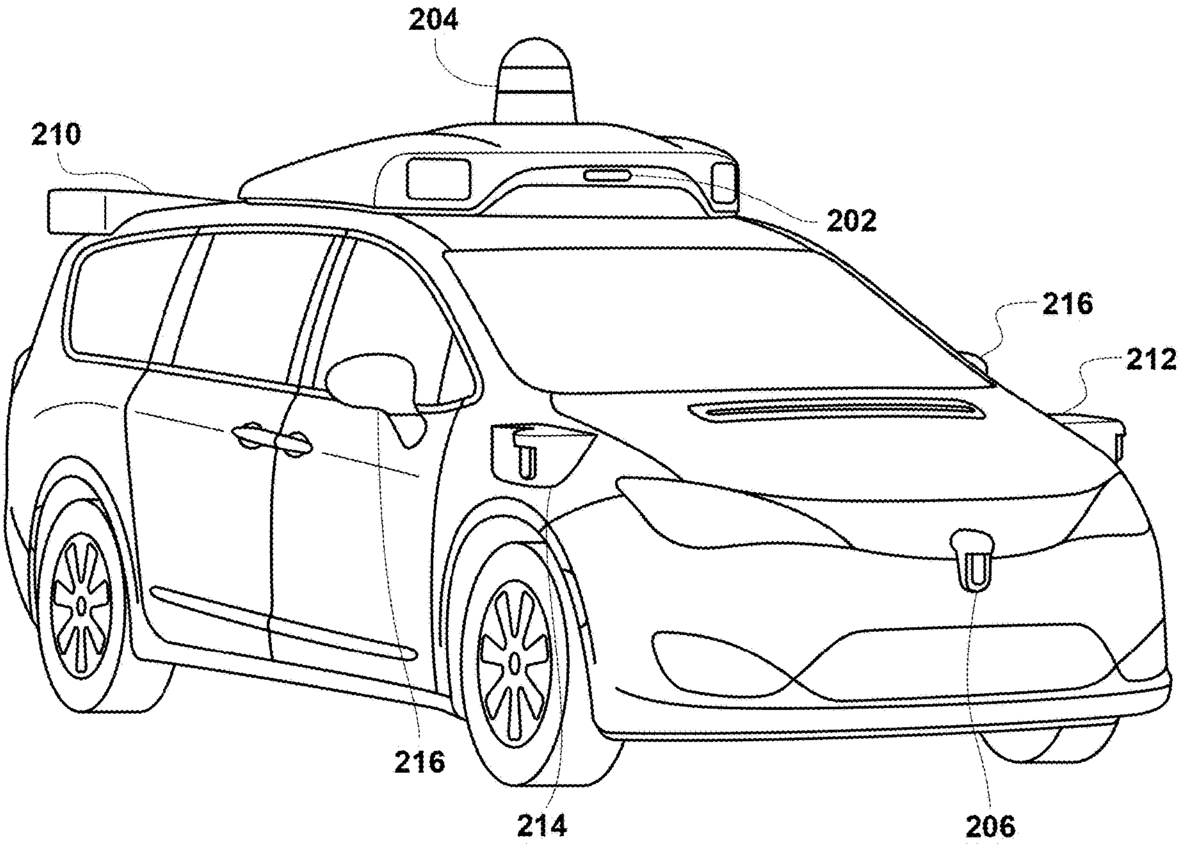
FIG. 2E is an illustration of a physical configuration of a vehicle, according to example embodiments.

Example methods and systems are contemplated herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the figures should not be viewed as limiting. It should be understood that other embodiments might include more or less of each element shown in a given figure. Further, some of the illustrated elements may be combined or omitted. Yet further, an example embodiment may include elements that are not illustrated in the figures.

Lidar devices can include one or more light emitters and one or more detectors used for detecting light that is emitted by the one or more light emitters and reflected by one or more objects in an environment surrounding the lidar device. As an example, the surrounding environment could include an interior or exterior environment, such as inside a building or outside of the building. Additionally or alternatively, the surrounding environment could include an interior environment of a vehicle. Additionally or alternatively, the surrounding environment could include a vicinity around and/or on a roadway. Examples of objects in the surrounding environment include, but are not limited to, other vehicles, traffic signs, pedestrians, roadway surfaces, buildings, terrain, etc. Additionally, the one or more light emitters could emit light into a local environment of the lidar system itself. For example, emitted light from the one or more light emitters could interact with a housing of the lidar system and/or surfaces or structures coupled to the lidar system. In some cases, the lidar system could be mounted to a vehicle. In such scenarios, the one or more light emitters can be configured to emit light that interacts with objects within a vicinity of the vehicle. The light emitters may include optical fiber amplifiers, laser diodes, light-emitting diodes (LEDs), etc. Described herein are lidar devices that include an array of VCSELs as the light emitter. VCSELs may offer multiple benefits over other light-emitting technologies when employed for a lidar device (e.g., as in automotive lidar applications). It is noted, however, that while VCSELs are described throughout this disclosure, many of the techniques described herein could also be employed, at least to some extent, with other light emitters, as well (e.g., LEDs, laser diodes, etc.).

The array of VCSELs may emit light pulses into an environment surrounding the lidar device (e.g., with each VCSEL targeting a different portion of the surrounding environment). These emissions may be caused by the charging and discharging of capacitors within a firing circuit of the lidar device across the VCSELs, for example. Further, in some embodiments, the firing circuit may be controlled by one or more control signals transmitted from a controller of the lidar device to the firing circuit. The emitted light pulses may then be reflected by one or more objects in the surrounding environment. Then, those reflections may return to the lidar device and be detected by one or more of the detectors of the lidar device (e.g., silicon photomultipliers (SiPMs), single-photon avalanche diodes (SPADs), avalanche photodiodes (APDs), charge-coupled devices (CCDs), etc.). By comparing the time of emission of the light pulse by the VCSELs to the time of detection of the reflection by the detectors, a distance to one or more objects in a surrounding environment may be determined. In some embodiments, the distance measurements may be combined (e.g., by the lidar device or an associated computing device connected to the lidar device) into a point cloud (e.g., a three-dimensional point cloud) representation of the surrounding environment.

When compared to other light emitters, VCSELs may show enhanced performance in a variety of aspects. As one example, VCSELs may have a smaller wavelength variability with respect to temperature than other types of light emitters. Laser diodes, for instance, may have a wavelength-temperature coefficient of around 0.3 nm/° C., whereas VCSELs may have a wavelength-temperature coefficient of around or less than 0.07 nm/° C. This is due, in part, to the fact that VCSELs include a shorter lasing cavity, which results in a larger mode spacing within the VCSEL than in other lasers. Because VCSELs may have lower temperature dependence, there is a larger range of temperatures over which the VCSELs can operate without causing issues within the lidar device (e.g., without emitting light that is outside of a range of wavelengths permitted by one or more optical filters used to filter out noise within the lidar device and/or without using additional components to maintain the temperature of the emitters).

Another advantage of VCSELs is the ability to more densely or more sparsely arrange the VCSELs within the VCSEL array relative to other types of light emitters (e.g., due to the VCSELs having an emission direction that differs from edge-emitting laser diodes).

Further, when fabricating the VCSEL array, it may be more straightforward to orient the emission surface of the VCSELs normal to a substrate on which the VCSEL array is fabricated when compared to attempting to accomplish the same goal with edge-emitting laser diodes or fiber lasers, for example. Similarly, it may also be more straightforward to have each of the emission surfaces of the VCSELs lie within the same horizontal plane than for other light-emitting technologies. Because the emission surfaces may be normal to the substrate and/or co-planar during fabrication, intermediate calibration and/or testing (e.g., for optical alignment or fabrication defects) can be performed during fabrication (e.g., before cleaving a wafer that includes many VCSEL arrays into single arrays), allowing for the correction of errors during fabrication. This is distinct from alternative light emitters where a complete assembly of light emitters with coupling and/or focusing optics (e.g., additional lenses or mirrors positioned adjacent to the light emitters) may be necessary before meaningful testing can be performed. This may lead to wasted time/fabrication efforts (e.g., when an emitter is defective, but its defects were not detected until testing occurred at a much later stage of assembly).

Still further, light emission from VCSELs can have a symmetric divergence, while light emission from other types of light emitters (e.g., edge-emitting laser diodes) may exhibit an asymmetric divergence (e.g., with an associated fast-axis divergence and a slow-axis divergence). The symmetric divergence can allow for elimination of some or all of the collimating optics within the lidar device that might be otherwise used if other types of light emitters are being employed.

Additionally, the amount of current required to power a VCSEL may be low relative to other types of light emitters. For example, the driving current used to power an array of VCSELs may be about 20 times less than the amount of driving current used to power an equivalently sized array of laser diodes (e.g., about 1.0 A/emitter as compared to about 20.0 A/emitter). This is in part because VCSELs have a relatively small active region relative to other types of lasers (e.g., other types of lasers that could be used as light emitters within lidar devices). This low current requirement may benefit a number of aspects of the lidar device, from the firing circuitry to the potential firing rate that can be accomplished using VCSELs (e.g., the lower threshold current used may correspond to an enhanced modulation bandwidth for the VCSELs).

In addition to everything described above, it is possible (as described herein) to electrically connect the VCSELs within the array into various arrangements that allow for the VCSELs to be individually addressable (i.e., such that a single VCSEL in the array can be fired or a single VCSEL in the array can be deactivated while the rest are sequentially fired). This can allow for selective firing schemes/patterns within the lidar device that can be beneficial in various respects (e.g., because minor adjustments can be made to the timing of each of the VCSELs individually). For example, if the presence of a retroreflector in the environment surrounding the lidar device is detected (e.g., by the lidar device or by an auxiliary detector associated with the lidar device, such as a camera), the VCSEL(s) in the array that is(are) directed toward the retroreflector can be deactivated so as to prevent the generation of a large return signal that could cause cross-talk between channels or otherwise cause detection issues within the lidar. Similarly, the ability to pick and choose which subsets of VCSELs in the array are fired may allow precise interrogation of certain regions of an environment surrounding the lidar device (e.g., regions of interest).

Embodiments described herein make use of the benefits described above by providing a lidar device that includes one or more arrays of VCSELs as light emitters. The VCSELs described herein may be top-emitting or bottom-emitting VCSELs, in various embodiments. In other words, the VCSELs described herein may emit light outward to a surrounding environment directly from the VCSEL (i.e., top-emitting) or through a substrate on which the VCSEL is mounted prior to directing the light to the surrounding environment (i.e., bottom-emitting). Further, the arrangement of the VCSELs within the array may be different across different embodiments (e.g., the arrangement may be designed to account for aberrations or misalignments present due to other components of the lidar device). In addition, as described herein, example lidar devices may include additional optics (e.g., lenses, mirrors, waveguides, etc.), firing circuitry (e.g., including diodes, switches, capacitors, inductors, signal generators, power sources, etc.), controller(s), detectors, etc.

The following description and accompanying drawings will elucidate features of various example embodiments. The embodiments provided are by way of example, and are not intended to be limiting. As such, the dimensions of the drawings are not necessarily to scale.

Example systems within the scope of the present disclosure will now be described in greater detail. An example system may be implemented in or may take the form of an automobile. Additionally, an example system may also be implemented in or take the form of various vehicles, such as cars, trucks, motorcycles, buses, airplanes, helicopters, drones, lawn mowers, earth movers, boats, submarines, all-terrain vehicles, snowmobiles, aircraft, recreational vehicles, amusement park vehicles, farm equipment or vehicles, construction equipment or vehicles, warehouse equipment or vehicles, factory equipment or vehicles, trams, golf carts, trains, trolleys, sidewalk delivery vehicles, robot devices, etc. Other vehicles are possible as well. Further, in some embodiments, example systems might not include a vehicle.

Referring now to the figures, FIG. 1 is a functional block diagram illustrating example vehicle 100, which may be configured to operate fully or partially in an autonomous mode. More specifically, vehicle 100 may operate in an autonomous mode without human interaction through receiving control instructions from a computing system. As part of operating in the autonomous mode, vehicle 100 may use sensors to detect and possibly identify objects of the surrounding environment to enable safe navigation. Additionally, example vehicle 100 may operate in a partially autonomous (i.e., semi-autonomous) mode in which some functions of the vehicle 100 are controlled by a human driver of the vehicle 100 and some functions of the vehicle 100 are controlled by the computing system. For example, vehicle 100 may also include subsystems that enable the driver to control operations of vehicle 100 such as steering, acceleration, and braking, while the computing system performs assistive functions such as lane-departure warnings/lane-keeping assist or adaptive cruise control based on other objects (e.g., vehicles) in the surrounding environment.

As shown in FIG. 1, vehicle 100 may include various subsystems, such as propulsion system 102, sensor system 104, control system 106, one or more peripherals 108, power supply 110, computer system 112 (could also be referred to as a computing system), data storage 114, and user interface 116. In other examples, vehicle 100 may include more or fewer subsystems, which can each include multiple elements. The subsystems and components of vehicle 100 may be interconnected in various ways. In addition, functions of vehicle 100 described herein can be divided into additional functional or physical components, or combined into fewer functional or physical components within embodiments. For instance, the control system 106 and the computer system 112 may be combined into a single system that operates the vehicle 100 in accordance with various operations.

Propulsion system 102 may include one or more components operable to provide powered motion for vehicle 100 and can include an engine/motor 118, an energy source 119, a transmission 120, and wheels/tires 121, among other possible components. For example, engine/motor 118 may be configured to convert energy source 119 into mechanical energy and can correspond to one or a combination of an internal combustion engine, an electric motor, steam engine, or Stirling engine, among other possible options. For instance, in some embodiments, propulsion system 102 may include multiple types of engines and/or motors, such as a gasoline engine and an electric motor.

Energy source 119 represents a source of energy that may, in full or in part, power one or more systems of vehicle 100 (e.g., engine/motor 118). For instance, energy source 119 can correspond to gasoline, diesel, other petroleum-based fuels, propane, other compressed gas-based fuels, ethanol, solar panels, batteries, and/or other sources of electrical power. In some embodiments, energy source 119 may include a combination of fuel tanks, batteries, capacitors, and/or flywheels.

Transmission 120 may transmit mechanical power from engine/motor 118 to wheels/tires 121 and/or other possible systems of vehicle 100. As such, transmission 120 may include a gearbox, a clutch, a differential, and a drive shaft, among other possible components. A drive shaft may include axles that connect to one or more wheels/tires 121.

Wheels/tires 121 of vehicle 100 may have various configurations within example embodiments. For instance, vehicle 100 may exist in a unicycle, bicycle/motorcycle, tricycle, or car/truck four-wheel format, among other possible configurations. As such, wheels/tires 121 may connect to vehicle 100 in various ways and can exist in different materials, such as metal and rubber.

Sensor system 104 can include various types of sensors, such as Global Positioning System (GPS) 122, inertial measurement unit (IMU) 124, radar 126, laser rangefinder/lidar 128, camera 130, steering sensor 123, and throttle/brake sensor 125, among other possible sensors. In some embodiments, sensor system 104 may also include sensors configured to monitor internal systems of the vehicle 100 (e.g., $O_2$ monitor, fuel gauge, engine oil temperature, brake wear).

GPS 122 may include a transceiver operable to provide information regarding the position of vehicle 100 with respect to the Earth. IMU 124 may have a configuration that uses one or more accelerometers and/or gyroscopes and may sense position and orientation changes of vehicle 100 based on inertial acceleration. For example, IMU 124 may detect a pitch and yaw of the vehicle 100 while vehicle 100 is stationary or in motion.

Radar 126 may represent one or more systems configured to use radio signals to sense objects, including the speed and heading of the objects, within the local environment of vehicle 100. As such, radar 126 may include antennas configured to transmit and receive radio signals. In some embodiments, radar 126 may correspond to a mountable radar system configured to obtain measurements of the surrounding environment of vehicle 100.

Laser rangefinder/lidar 128 may include one or more laser sources, a laser scanner, and one or more detectors, among other system components, and may operate in a coherent mode (e.g., using heterodyne detection) or in an incoherent detection mode (i.e., time-of-flight mode). In some embodiments, the one or more detectors of the laser rangefinder/lidar 128 may include one or more photodetectors. Such photodetectors may be especially sensitive detectors. In some examples, such photodetectors may be capable of detecting single photons (e.g., SPADs). Further, such photodetectors can be arranged (e.g., through an electrical connection in series) into an array (e.g., as in a SiPM). In some examples, the one or more photodetectors are Geiger-mode operated devices and the lidar includes subcomponents designed for such Geiger-mode operation.

Camera 130 may include one or more devices (e.g., still camera, video camera, a thermal imaging camera, a stereo camera, a night vision camera, etc.) configured to capture images of the surrounding environment of vehicle 100.

Steering sensor 123 may sense a steering angle of vehicle 100, which may involve measuring an angle of the steering wheel or measuring an electrical signal representative of the angle of the steering wheel. In some embodiments, steering sensor 123 may measure an angle of the wheels of the vehicle 100, such as detecting an angle of the wheels with respect to a forward axis of the vehicle 100. Steering sensor 123 may also be configured to measure a combination (or a subset) of the angle of the steering wheel, electrical signal representing the angle of the steering wheel, and the angle of the wheels of vehicle 100.

Throttle/brake sensor 125 may detect the position of either the throttle position or brake position of vehicle 100. For instance, throttle/brake sensor 125 may measure the angle of both the gas pedal (throttle) and brake pedal or may measure an electrical signal that could represent, for instance, an angle of a gas pedal (throttle) and/or an angle of a brake pedal. Throttle/brake sensor 125 may also measure an angle of a throttle body of vehicle 100, which may include part of the physical mechanism that provides modulation of energy source 119 to engine/motor 118 (e.g., a butterfly valve or carburetor). Additionally, throttle/brake sensor 125 may measure a pressure of one or more brake pads on a rotor of vehicle 100 or a combination (or a subset) of the angle of the gas pedal (throttle) and brake pedal, electrical signal representing the angle of the gas pedal (throttle) and brake pedal, the angle of the throttle body, and the pressure that at least one brake pad is applying to a rotor of vehicle 100. In other embodiments, throttle/brake sensor 125 may be configured to measure a pressure applied to a pedal of the vehicle, such as a throttle or brake pedal.

Control system 106 may include components configured to assist in navigating vehicle 100, such as steering unit 132, throttle 134, brake unit 136, sensor fusion algorithm 138, computer vision system 140, navigation/pathing system 142, and obstacle avoidance system 144. More specifically, steering unit 132 may be operable to adjust the heading of vehicle 100, and throttle 134 may control the operating speed of engine/motor 118 to control the acceleration of vehicle 100. Brake unit 136 may decelerate vehicle 100, which may involve using friction to decelerate wheels/tires 121. In some embodiments, brake unit 136 may convert kinetic energy of wheels/tires 121 to electric current for subsequent use by a system or systems of vehicle 100.

Sensor fusion algorithm 138 may include a Kalman filter, Bayesian network, or other algorithms that can process data from sensor system 104. In some embodiments, sensor fusion algorithm 138 may provide assessments based on incoming sensor data, such as evaluations of individual objects and/or features, evaluations of a particular situation, and/or evaluations of potential impacts within a given situation.

Computer vision system 140 may include hardware and software operable to process and analyze images in an effort to determine objects, environmental objects (e.g., traffic lights, roadway boundaries, etc.), and obstacles. As such, computer vision system 140 may use object recognition, Structure From Motion (SFM), video tracking, and other algorithms used in computer vision, for instance, to recognize objects, map an environment, track objects, estimate the speed of objects, etc.

Navigation/pathing system 142 may determine a driving path for vehicle 100, which may involve dynamically adjusting navigation during operation. As such, navigation/pathing system 142 may use data from sensor fusion algorithm 138, GPS 122, and maps, among other sources to navigate vehicle 100. Obstacle avoidance system 144 may evaluate potential obstacles based on sensor data and cause systems of vehicle 100 to avoid or otherwise negotiate the potential obstacles.

As shown in FIG. 1, vehicle 100 may also include peripherals 108, such as wireless communication system 146, touchscreen 148, microphone 150, and/or speaker 152. Peripherals 108 may provide controls or other elements for a user to interact with user interface 116. For example, touchscreen 148 may provide information to users of vehicle 100. User interface 116 may also accept input from the user via touchscreen 148. Peripherals 108 may also enable vehicle 100 to communicate with devices, such as other vehicle devices.

Wireless communication system 146 may wirelessly communicate with one or more devices directly or via a communication network. For example, wireless communication system 146 could use 3G cellular communication, such as code-division multiple access (CDMA), evolution-data optimized (EVDO), global system for mobile communications (GSM)/general packet radio service (GPRS), or cellular communication, such as 4G worldwide interoperability for microwave access (WiMAX) or long-term evolution (LTE), or 5G. Alternatively, wireless communication system 146 may communicate with a wireless local area network (WLAN) using WIFI® or other possible connections. Wireless communication system 146 may also communicate directly with a device using an infrared link, Bluetooth, or ZigBee, for example. Other wireless protocols, such as various vehicular communication systems, are possible within the context of the disclosure. For example, wireless communication system 146 may include one or more dedicated short-range communications (DSRC) devices that could include public and/or private data communications between vehicles and/or roadside stations.

Vehicle 100 may include power supply 110 for powering components. Power supply 110 may include a rechargeable lithium-ion or lead-acid battery in some embodiments. For instance, power supply 110 may include one or more batteries configured to provide electrical power. Vehicle 100 may also use other types of power supplies. In an example embodiment, power supply 110 and energy source 119 may be integrated into a single energy source.

Vehicle 100 may also include computer system 112 to perform operations, such as operations described therein. As such, computer system 112 may include at least one processor 113 (which could include at least one microprocessor) operable to execute instructions 115 stored in a non-transitory, computer-readable medium, such as data storage 114. In some embodiments, computer system 112 may represent a plurality of computing devices that may serve to control individual components or subsystems of vehicle 100 in a distributed fashion.

In some embodiments, data storage 114 may contain instructions 115 (e.g., program logic) executable by processor 113 to execute various functions of vehicle 100, including those described above in connection with FIG. 1. Data storage 114 may contain additional instructions as well, including instructions to transmit data to, receive data from, interact with, and/or control one or more of propulsion system 102, sensor system 104, control system 106, and peripherals 108.

In addition to instructions 115, data storage 114 may store data such as roadway maps, path information, among other information. Such information may be used by vehicle 100 and computer system 112 during the operation of vehicle 100 in the autonomous, semi-autonomous, and/or manual modes.

Vehicle 100 may include user interface 116 for providing information to or receiving input from a user of vehicle 100. User interface 116 may control or enable control of content and/or the layout of interactive images that could be displayed on touchscreen 148. Further, user interface 116 could include one or more input/output devices within the set of peripherals 108, such as wireless communication system 146, touchscreen 148, microphone 150, and speaker 152.

Computer system 112 may control the function of vehicle 100 based on inputs received from various subsystems (e.g., propulsion system 102, sensor system 104, and control system 106), as well as from user interface 116. For example, computer system 112 may utilize input from sensor system 104 in order to estimate the output produced by propulsion system 102 and control system 106. Depending upon the embodiment, computer system 112 could be operable to monitor many aspects of vehicle 100 and its subsystems. In some embodiments, computer system 112 may disable some or all functions of the vehicle 100 based on signals received from sensor system 104.

The components of vehicle 100 could be configured to work in an interconnected fashion with other components within or outside their respective systems. For instance, in an example embodiment, camera 130 could capture a plurality of images that could represent information about a state of a surrounding environment of vehicle 100 operating in an autonomous mode. The state of the surrounding environment could include parameters of the road on which the vehicle is operating. For example, computer vision system 140 may be able to recognize the slope (grade) or other features based on the plurality of images of a roadway. Additionally, the combination of GPS 122 and the features recognized by computer vision system 140 may be used with map data stored in data storage 114 to determine specific road parameters. Further, radar 126 and/or laser rangefinder/lidar 128, and/or some other environmental mapping, ranging, and/or positioning sensor system may also provide information about the surroundings of the vehicle.

In other words, a combination of various sensors (which could be termed input-indication and output-indication sensors) and computer system 112 could interact to provide an indication of an input provided to control a vehicle or an indication of the surroundings of a vehicle.

In some embodiments, computer system 112 may make a determination about various objects based on data that is provided by systems other than the radio system. For example, vehicle 100 may have lasers or other optical sensors configured to sense objects in a field of view of the vehicle. Computer system 112 may use the outputs from the various sensors to determine information about objects in a field of view of the vehicle, and may determine distance and direction information to the various objects. Computer system 112 may also determine whether objects are desirable or undesirable based on the outputs from the various sensors.

Although FIG. 1 shows various components of vehicle 100 (i.e., wireless communication system 146, computer system 112, data storage 114, and user interface 116) as being integrated into the vehicle 100, one or more of these components could be mounted or associated separately from vehicle 100. For example, data storage 114 could, in part or in full, exist separate from vehicle 100. Thus, vehicle 100 could be provided in the form of device elements that may be located separately or together. The device elements that make up vehicle 100 could be communicatively coupled together in a wired and/or wireless fashion.

FIGS. 2A-2E shows an example vehicle 200 (e.g., a fully autonomous vehicle or semi-autonomous vehicle) that can include some or all of the functions described in connection with vehicle 100 in reference to FIG. 1. Although vehicle 200 is illustrated in FIGS. 2A-2E as a van with side view mirrors 216 for illustrative purposes, the present disclosure is not so limited. For instance, the vehicle 200 can represent a truck, a car, a semi-trailer truck, a motorcycle, a golf cart, an off-road vehicle, a farm vehicle, or any other vehicle that is described elsewhere herein (e.g., buses, boats, airplanes, helicopters, drones, lawn mowers, earth movers, submarines, all-terrain vehicles, snowmobiles, aircraft, recreational vehicles, amusement park vehicles, farm equipment, construction equipment or vehicles, warehouse equipment or vehicles, factory equipment or vehicles, trams, trains, trolleys, sidewalk delivery vehicles, and robot devices, etc.).

The example vehicle 200 may include one or more sensor systems 202, 204, 206, 208, 210, 212, 214, and 218. In some embodiments, sensor systems 202, 204, 206, 208, 210, 212, 214, and/or 218 could represent one or more optical systems (e.g. cameras, etc.), one or more lidars, one or more radars, one or more range finders, one or more inertial sensors, one or more humidity sensors, one or more acoustic sensors (e.g., microphones, sonar devices, etc.), or one or more other sensors configured to sense information about an environment surrounding the vehicle 200. In other words, any sensor system described elsewhere herein could be coupled to the vehicle 200 and/or could be utilized in conjunction with various operations of the vehicle 200. As an example, a lidar system could be utilized in self-driving or other types of navigation, planning, perception, and/or mapping operations of the vehicle 200. In addition, sensor systems 202, 204, 206, 208, 210, 212, 214, and/or 218 could represent a combination of sensors described herein (e.g., one or more lidars and radars, one or more lidars and cameras, one or more cameras and radars, etc.).

In some examples, the sensor systems could be disposed in various other locations on the vehicle 200 and could have fields of view that correspond to internal and/or surrounding environments of the vehicle 200. While the one or more sensor systems 202, 204, 206, 208, 210, 212, 214, and/or 218 are illustrated on certain locations on vehicle 200, it will be understood that more or fewer sensor systems could be utilized with vehicle 200. Further, the locations of such sensor systems could be adjusted, modified, or otherwise changed as compared to the locations of the sensor systems illustrated in FIGS. 2A-2E.

The one or more sensor systems 202, 204, 206, 208, 210, 212, 214, and/or 218 could include one or more lidar sensors. For example, the lidar sensors could include a plurality of light-emitter devices arranged over a range of angles with respect to a given plane (e.g., the x-y plane). For example, one or more of the sensor systems 202, 204, 206, 208, 210, 212, 214, and/or 218 may be configured to rotate or pivot about an axis (e.g., the z-axis) perpendicular to the given plane so as to illuminate an environment surrounding the vehicle 200 with light pulses. Based on detecting various aspects of reflected light pulses (e.g., the elapsed time of flight, polarization, intensity, etc.), information about the surrounding environment may be determined.

In an example embodiment, sensor systems 202, 204, 206, 208, 210, 212, 214, and/or 218 may be configured to provide respective point cloud information that may relate to physical objects within the surrounding environment of the vehicle 200. While vehicle 200 and sensor systems 202, 204, 206, 208, 210, 212, 214, and 218 are illustrated as including certain features, it will be understood that other types of sensor systems are contemplated within the scope of the present disclosure. Further, the example vehicle 200 can include any of the components described in connection with vehicle 100 of FIG. 1.

Note that the number, location, and type of sensor units (e.g., 202, 204, etc.) depicted in FIGS. 2A-E are intended as a non-limiting example of the location, number, and type of such sensor units of an autonomous or semi-autonomous vehicle. Alternative numbers, locations, types, and configurations of such sensors are possible (e.g., to comport with vehicle size, shape, aerodynamics, fuel economy, aesthetics, or other conditions, to reduce cost, to adapt to specialized environmental or application circumstances, etc.).

The sensor system 202 may be mounted atop the vehicle 200 and may include one or more sensors configured to detect information about an environment surrounding the vehicle 200, and output indications of the information. For example, sensor system 202 can include any combination of cameras, radars, lidars, range finders, inertial sensors, humidity sensors, and acoustic sensors (e.g., microphones, sonar devices, etc.). The sensor system 202 can include one or more movable mounts that could be operable to adjust the orientation of one or more sensors in the sensor system 202. In one embodiment, the movable mount could include a rotating platform that could scan sensors so as to obtain information from each direction around the vehicle 200. In another embodiment, the movable mount of the sensor system 202 could be movable in a scanning fashion within a particular range of angles and/or azimuths and/or elevations. The sensor system 202 could be mounted atop the roof of a car, although other mounting locations are possible.

Additionally, the sensors of sensor system 202 could be distributed in different locations and need not be collocated in a single location. Furthermore, each sensor of sensor system 202 can be configured to be moved or scanned independently of other sensors of sensor system 202. Additionally or alternatively, multiple sensors may be mounted at one or more of the sensor locations 202, 204, 206, 208, 210, 212, 214, and/or 218. For example, there may be two lidar devices mounted at a sensor location and/or there may be one lidar device and one radar mounted at a sensor location.

In an example configuration, one or more radars can be located on vehicle 200. For example, one or more sensor systems 202, 204, 206, 208, 210, 212, 214, and/or 218 could include one or more radars. In some examples, one or more radars can be located near the rear of the vehicle 200 (e.g., sensor systems 208, 210, etc.), to actively scan the environment near the back of the vehicle 200 for the presence of radio-reflective objects. Similarly, one or more radars can be located near the front of the vehicle 200 (e.g., sensor systems 212, 214, etc.) to actively scan the environment near the front of the vehicle 200. A radar can be situated, for example, in a location suitable to illuminate a region including a forward-moving path of the vehicle 200 without occlusion by other features of the vehicle 200. For example, a radar can be embedded in and/or mounted in or near the front bumper, front headlights, cowl, and/or hood, etc. Furthermore, one or more additional radars can be located to actively scan the side and/or rear of the vehicle 200 for the presence of radio-reflective objects, such as by including such devices in or near the rear bumper, side panels, rocker panels, and/or undercarriage, etc.

The vehicle 200 can include one or more cameras. For example, the one or more sensor systems 202, 204, 206, 208, 210, 212, 214, and/or 218 could include one or more cameras. The camera can be a photosensitive instrument, such as a still camera, a video camera, a thermal imaging camera, a stereo camera, a night vision camera, etc., that is configured to capture a plurality of images of the surrounding environment of the vehicle 200. To this end, the camera can be configured to detect visible light, and can additionally or alternatively be configured to detect light from other portions of the spectrum, such as infrared or ultraviolet light. The camera can be a two-dimensional detector, and can optionally have a three-dimensional spatial range of sensitivity. In some embodiments, the camera can include, for example, a range detector configured to generate a two-dimensional image indicating distance from the camera to a number of points in the surrounding environment. To this end, the camera may use one or more range detecting techniques. For example, the camera can provide range information by using a structured light technique in which the vehicle 200 illuminates an object in the surrounding environment with a predetermined light pattern, such as a grid or checkerboard pattern and uses the camera to detect a reflection of the predetermined light pattern from environmental surroundings. Based on distortions in the reflected light pattern, the vehicle 200 can determine the distance to the points on the object. The predetermined light pattern may comprise infrared light, or radiation at other suitable wavelengths for such measurements. In some examples, the camera can be mounted inside a front windshield of the vehicle 200. Specifically, the camera can be situated to capture images from a forward-looking view with respect to the orientation of the vehicle 200. Other mounting locations and viewing angles of the camera can also be used, either inside or outside the vehicle 200. Further, the camera can have associated optics operable to provide an adjustable field of view. Still further, the camera can be mounted to vehicle 200 with a movable mount to vary a pointing angle of the camera, such as via a pan/tilt mechanism.

Although not shown in FIGS. 2A-2E, the vehicle 200 can include a wireless communication system. The wireless communication system may include wireless transmitters and receivers that could be configured to communicate with devices external or internal to the vehicle 200. Specifically, the wireless communication system could include transceivers configured to communicate with other vehicles and/or computing devices, for instance, in a vehicular communication system or a roadway station. Examples of such vehicular communication systems include DSRC, radio frequency identification (RFID), and other proposed communication standards directed towards intelligent transport systems.

The vehicle 200 may include one or more other components in addition to or instead of those shown. The additional components may include electrical or mechanical functionality.

A control system of the vehicle 200 may be configured to control the vehicle 200 in accordance with a control strategy from among multiple possible control strategies. The control system may be configured to receive information from sensors coupled to the vehicle 200 (on or off the vehicle 200), modify the control strategy (and an associated driving behavior) based on the information, and control the vehicle 200 in accordance with the modified control strategy. The control system further may be configured to monitor the information received from the sensors, and continuously evaluate driving conditions; and also may be configured to modify the control strategy and driving behavior based on changes in the driving conditions.

Figure 3:
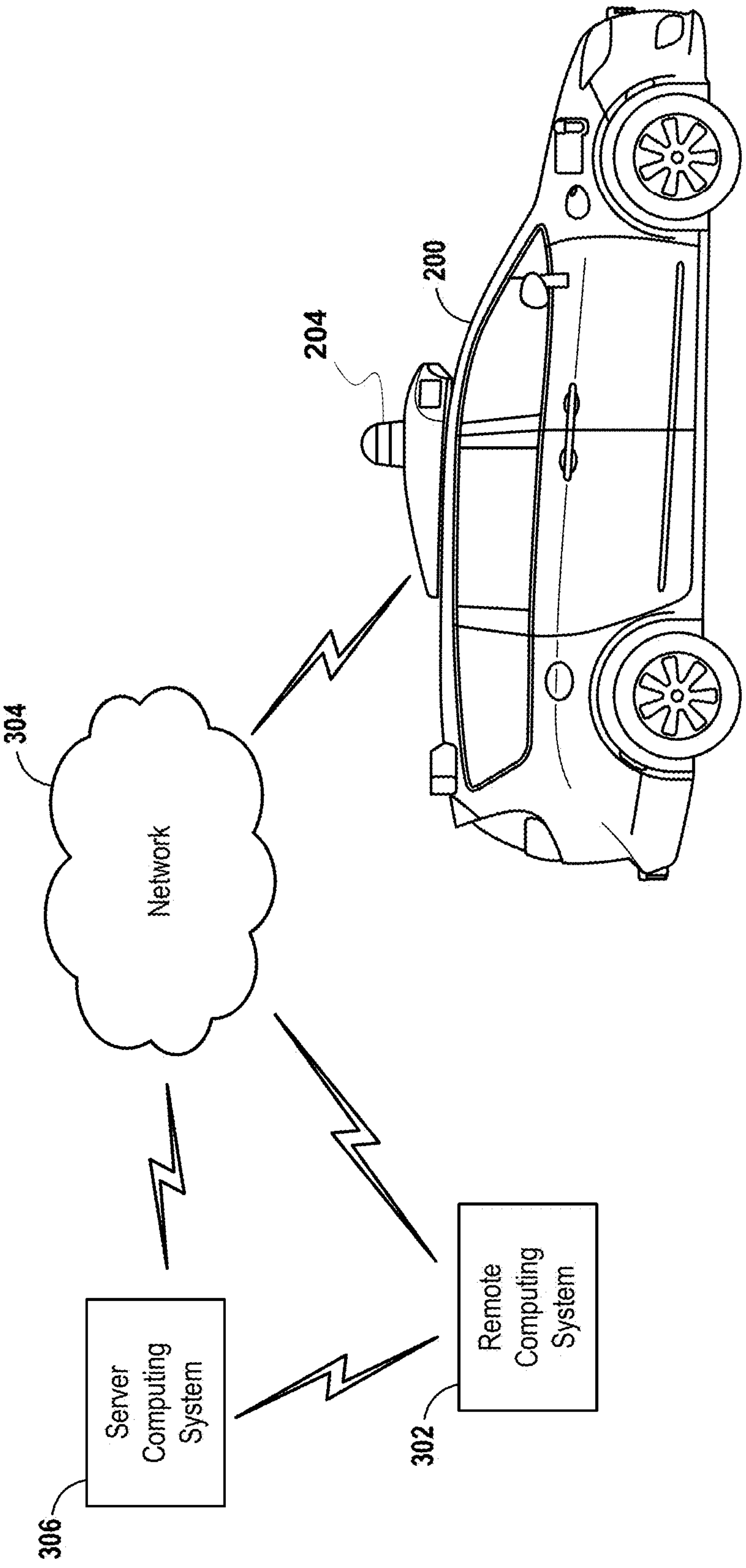
FIG. 3 is a conceptual illustration of wireless communication between various computing systems related to an autonomous vehicle, according to example embodiments.

FIG. 3 is a conceptual illustration of wireless communication between various computing systems related to an autonomous vehicle, according to example embodiments. In particular, wireless communication may occur between remote computing system 302 and vehicle 200 via network 304. Wireless communication may also occur between server computing system 306 and remote computing system 302, and between server computing system 306 and vehicle 200.

Vehicle 200 can correspond to various types of vehicles capable of transporting passengers or objects between locations, and may take the form of any one or more of the vehicles discussed above. In some instances, vehicle 200 may operate in an autonomous mode that enables a control system to safely navigate vehicle 200 between destinations using sensor measurements. When operating in an autonomous mode, vehicle 200 may navigate with or without passengers. As a result, vehicle 200 may pick up and drop off passengers between desired destinations.

Remote computing system 302 may represent any type of device related to remote assistance techniques, including but not limited to those described herein. Within examples, remote computing system 302 may represent any type of device configured to (i) receive information related to vehicle 200, (ii) provide an interface through which a human operator can in turn perceive the information and input a response related to the information, and (iii) transmit the response to vehicle 200 or to other devices. Remote computing system 302 may take various forms, such as a workstation, a desktop computer, a laptop, a tablet, a mobile phone (e.g., a smart phone), and/or a server. In some examples, remote computing system 302 may include multiple computing devices operating together in a network configuration.

Remote computing system 302 may include one or more subsystems and components similar or identical to the subsystems and components of vehicle 200. At a minimum, remote computing system 302 may include a processor configured for performing various operations described herein. In some embodiments, remote computing system 302 may also include a user interface that includes input/output devices, such as a touchscreen and a speaker. Other examples are possible as well.

Network 304 represents infrastructure that enables wireless communication between remote computing system 302 and vehicle 200. Network 304 also enables wireless communication between server computing system 306 and remote computing system 302, and between server computing system 306 and vehicle 200.

The position of remote computing system 302 can vary within examples. For instance, remote computing system 302 may have a remote position from vehicle 200 that has a wireless communication via network 304. In another example, remote computing system 302 may correspond to a computing device within vehicle 200 that is separate from vehicle 200, but with which a human operator can interact while a passenger or driver of vehicle 200. In some examples, remote computing system 302 may be a computing device with a touchscreen operable by the passenger of vehicle 200.

In some embodiments, operations described herein that are performed by remote computing system 302 may be additionally or alternatively performed by vehicle 200 (i.e., by any system(s) or subsystem(s) of vehicle 200). In other words, vehicle 200 may be configured to provide a remote assistance mechanism with which a driver or passenger of the vehicle can interact.

Server computing system 306 may be configured to wirelessly communicate with remote computing system 302 and vehicle 200 via network 304 (or perhaps directly with remote computing system 302 and/or vehicle 200). Server computing system 306 may represent any computing device configured to receive, store, determine, and/or send information relating to vehicle 200 and the remote assistance thereof. As such, server computing system 306 may be configured to perform any operation(s), or portions of such operation(s), that is/are described herein as performed by remote computing system 302 and/or vehicle 200. Some embodiments of wireless communication related to remote assistance may utilize server computing system 306, while others may not.

Server computing system 306 may include one or more subsystems and components similar or identical to the subsystems and components of remote computing system 302 and/or vehicle 200, such as a processor configured for performing various operations described herein, and a wireless communication interface for receiving information from, and providing information to, remote computing system 302 and vehicle 200.

The various systems described above may perform various operations. These operations and related features will now be described.

In line with the discussion above, a computing system (e.g., remote computing system 302, server computing system 306, or a computing system local to vehicle 200) may operate to use a camera to capture images of the surrounding environment of an autonomous vehicle. In general, at least one computing system will be able to analyze the images and possibly control the autonomous vehicle.

In some embodiments, to facilitate autonomous operation a vehicle (e.g., vehicle 200) may receive data representing objects in an environment surrounding the vehicle (also referred to herein as "environment data") in a variety of ways. A sensor system on the vehicle may provide the environment data representing objects of the surrounding environment. For example, the vehicle may have various sensors, including a camera, a radar unit, a laser range finder, a microphone, a radio unit, and other sensors. Each of these sensors may communicate environment data to a processor in the vehicle about information each respective sensor receives.

In one example, a camera may be configured to capture still images and/or video. In some embodiments, the vehicle may have more than one camera positioned in different orientations. Also, in some embodiments, the camera may be able to move to capture images and/or video in different directions. The camera may be configured to store captured images and video to a memory for later processing by a processing system of the vehicle. The captured images and/or video may be the environment data. Further, the camera may include an image sensor as described herein.

In another example, a radar unit may be configured to transmit an electromagnetic signal that will be reflected by various objects near the vehicle, and then capture electromagnetic signals that reflect off the objects. The captured reflected electromagnetic signals may enable the radar system (or processing system) to make various determinations about objects that reflected the electromagnetic signal. For example, the distances to and positions of various reflecting objects may be determined. In some embodiments, the vehicle may have more than one radar in different orientations. The radar system may be configured to store captured information to a memory for later processing by a processing system of the vehicle. The information captured by the radar system may be environment data.

In another example, a laser range finder may be configured to transmit an electromagnetic signal (e.g., infrared light, such as that from a gas or diode laser, or other possible light source) that will be reflected by target objects near the vehicle. The laser range finder may be able to capture the reflected electromagnetic (e.g., infrared light) signals. The captured reflected electromagnetic signals may enable the range-finding system (or processing system) to determine a range to various objects. The laser range finder may also be able to determine a velocity or speed of target objects and store it as environment data.

Additionally, in an example, a microphone may be configured to capture audio of the environment surrounding the vehicle. Sounds captured by the microphone may include emergency vehicle sirens and the sounds of other vehicles. For example, the microphone may capture the sound of the siren of an ambulance, fire engine, or police vehicle. A processing system may be able to identify that the captured audio signal is indicative of an emergency vehicle. In another example, the microphone may capture the sound of an exhaust of another vehicle, such as that from a motorcycle. A processing system may be able to identify that the captured audio signal is indicative of a motorcycle. The data captured by the microphone may form a portion of the environment data.

In yet another example, the radio unit may be configured to transmit an electromagnetic signal that may take the form of a Bluetooth signal, 802.11 signal, and/or other radio technology signal. The first electromagnetic radiation signal may be transmitted via one or more antennas located in a radio unit. Further, the first electromagnetic radiation signal may be transmitted with one of many different radio-signaling modes. However, in some embodiments it is desirable to transmit the first electromagnetic radiation signal with a signaling mode that requests a response from devices located near the autonomous vehicle. The processing system may be able to detect nearby devices based on the responses communicated back to the radio unit and use this communicated information as a portion of the environment data.

In some embodiments, the processing system may be able to combine information from the various sensors in order to make further determinations of the surrounding environment of the vehicle. For example, the processing system may combine data from both radar information and a captured image to determine if another vehicle or pedestrian is in front of the autonomous vehicle. In other embodiments, other combinations of sensor data may be used by the processing system to make determinations about the surrounding environment.

While operating in an autonomous mode (or semi-autonomous mode), the vehicle may control its operation with little-to-no human input. For example, a human-operator may enter an address into the vehicle and the vehicle may then be able to drive, without further input from the human (e.g., the human does not have to steer or touch the brake/gas pedals), to the specified destination. Further, while the vehicle is operating autonomously, the sensor system may be receiving environment data. The processing system of the vehicle may alter the control of the vehicle based on environment data received from the various sensors. In some examples, the vehicle may alter a velocity of the vehicle in response to environment data from the various sensors. The vehicle may change velocity in order to avoid obstacles, obey traffic laws, etc. When a processing system in the vehicle identifies objects near the vehicle, the vehicle may be able to change velocity, or alter the movement in another way.

When the vehicle detects an object but is not highly confident in the detection of the object, the vehicle can request a human operator (or a more powerful computer) to perform one or more remote assistance tasks, such as (i) confirm whether the object is in fact present in the surrounding environment (e.g., if there is actually a stop sign or if there is actually no stop sign present), (ii) confirm whether the vehicle's identification of the object is correct, (iii) correct the identification if the identification was incorrect and/or (iv) provide a supplemental instruction (or modify a present instruction) for the autonomous vehicle. Remote assistance tasks may also include the human operator providing an instruction to control operation of the vehicle (e.g., instruct the vehicle to stop at a stop sign if the human operator determines that the object is a stop sign), although in some scenarios, the vehicle itself may control its own operation based on the human operator's feedback related to the identification of the object.

To facilitate this, the vehicle may analyze the environment data representing objects of the surrounding environment to determine at least one object having a detection confidence below a threshold. A processor in the vehicle may be configured to detect various objects of the surrounding environment based on environment data from various sensors. For example, in one embodiment, the processor may be configured to detect objects that may be important for the vehicle to recognize. Such objects may include pedestrians, street signs, other vehicles, indicator signals on other vehicles, and other various objects detected in the captured environment data.

The detection confidence may be indicative of a likelihood that the determined object is correctly identified in the surrounding environment, or is present in the surrounding environment. For example, the processor may perform object detection of objects within image data in the received environment data, and determine that at least one object has the detection confidence below the threshold based on being unable to identify the object with a detection confidence above the threshold. If a result of an object detection or object recognition of the object is inconclusive, then the detection confidence may be low or below the set threshold.

The vehicle may detect objects of the surrounding environment in various ways depending on the source of the environment data. In some embodiments, the environment data may come from a camera and be image or video data. In other embodiments, the environment data may come from a lidar unit. The vehicle may analyze the captured image or video data to identify objects in the image or video data. The methods and apparatuses may be configured to monitor image and/or video data for the presence of objects of the surrounding environment. In other embodiments, the environment data may be radar, audio, or other data. The vehicle may be configured to identify objects of the surrounding environment based on the radar, audio, or other data.

In some embodiments, the techniques the vehicle uses to detect objects may be based on a set of known data. For example, data related to environmental objects may be stored to a memory located in the vehicle. The vehicle may compare received data to the stored data to determine objects. In other embodiments, the vehicle may be configured to determine objects based on the context of the data. For example, street signs related to construction may generally have an orange color. Accordingly, the vehicle may be configured to detect objects that are orange, and located near the side of roadways as construction-related street signs. Additionally, when the processing system of the vehicle detects objects in the captured data, it also may calculate a confidence for each object.

Further, the vehicle may also have a confidence threshold. The confidence threshold may vary depending on the type of object being detected. For example, the confidence threshold may be lower for an object that may require a quick responsive action from the vehicle, such as brake lights on another vehicle. However, in other embodiments, the confidence threshold may be the same for all detected objects. When the confidence associated with a detected object is greater than the confidence threshold, the vehicle may assume the object was correctly recognized and responsively adjust the control of the vehicle based on that assumption.

When the confidence associated with a detected object is less than the confidence threshold, the actions that the vehicle takes may vary. In some embodiments, the vehicle may react as if the detected object is present despite the low confidence level. In other embodiments, the vehicle may react as if the detected object is not present.

When the vehicle detects an object of the surrounding environment, it may also calculate a confidence associated with the specific detected object. The confidence may be calculated in various ways depending on the embodiment. In one example, when detecting objects of the surrounding environment, the vehicle may compare environment data to predetermined data relating to known objects. The closer the match between the environment data and the predetermined data, the higher the confidence. In other embodiments, the vehicle may use mathematical analysis of the environment data to determine the confidence associated with the objects.

In response to determining that an object has a detection confidence that is below the threshold, the vehicle may transmit, to the remote computing system, a request for remote assistance with the identification of the object. As discussed above, the remote computing system may take various forms. For example, the remote computing system may be a computing device within the vehicle that is separate from the vehicle, but with which a human operator can interact while a passenger or driver of the vehicle, such as a touchscreen interface for displaying remote assistance information. Additionally or alternatively, as another example, the remote computing system may be a remote computer terminal or other device that is located at a location that is not near the vehicle.

The request for remote assistance may include the environment data that includes the object, such as image data, audio data, etc. The vehicle may transmit the environment data to the remote computing system over a network (e.g., network 304), and in some embodiments, via a server (e.g., server computing system 306). The human operator of the remote computing system may in turn use the environment data as a basis for responding to the request.

In some embodiments, when the object is detected as having a confidence below the confidence threshold, the object may be given a preliminary identification, and the vehicle may be configured to adjust the operation of the vehicle in response to the preliminary identification. Such an adjustment of operation may take the form of stopping the vehicle, switching the vehicle to a human-controlled mode, changing a velocity of the vehicle (e.g., a speed and/or direction), among other possible adjustments.

In other embodiments, even if the vehicle detects an object having a confidence that meets or exceeds the threshold, the vehicle may operate in accordance with the detected object (e.g., come to a stop if the object is identified with high confidence as a stop sign), but may be configured to request remote assistance at the same time as (or at a later time from) when the vehicle operates in accordance with the detected object.

Figure 4A:
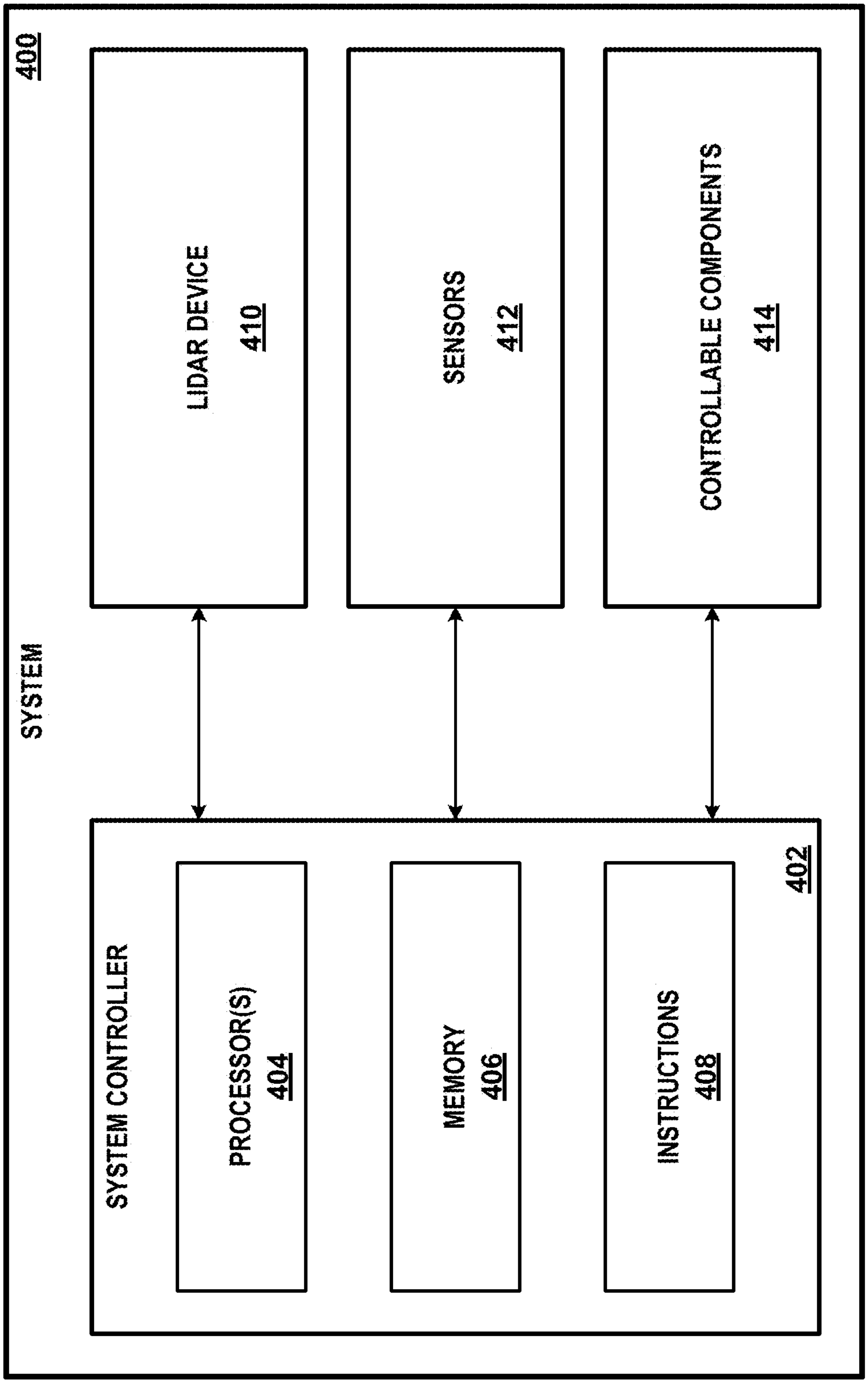
FIG. 4A is a block diagram of a system including a lidar device, according to example embodiments.

FIG. 4A is a block diagram of a system, according to example embodiments. In particular, FIG. 4A shows a system 400 that includes a system controller 402, a lidar device 410, a plurality of sensors 412, and a plurality of controllable components 414. System controller 402 includes processor(s) 404, a memory 406, and instructions 408 stored on the memory 406 and executable by the processor(s) 404 to perform functions.

The processor(s) 404 can include one or more processors, such as one or more general-purpose microprocessors and/or one or more special purpose microprocessors. The one or more processors may include, for instance, an application-specific integrated circuit (ASIC) or a field-programmable gate array (FPGA). Other types of processors, computers, or devices configured to carry out software instructions are contemplated herein.

The memory 406 may include a computer-readable medium, such as a non-transitory, computer-readable medium, which may include without limitation, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The lidar device 410, described further below, includes a plurality of light emitters configured to emit light (e.g., in light pulses) and one or more light detectors configured to detect light (e.g., reflected portions of the light pulses). The lidar device 410 may generate three-dimensional (3D) point cloud data from outputs of the light detector(s), and provide the 3D point cloud data to the system controller 402. The system controller 402, in turn, may perform operations on the 3D point cloud data to determine the characteristics of a surrounding environment (e.g., relative positions of objects within a surrounding environment, edge detection, object detection, proximity sensing, or the like).

Similarly, the system controller 402 may use outputs from the plurality of sensors 412 to determine the characteristics of the system 400 and/or characteristics of the surrounding environment. For example, the sensors 412 may include one or more of a GPS, an Inertial Measurement Unit (IMU), an image capture device (e.g., a camera), a light sensor, a heat sensor, and other sensors indicative of parameters relevant to the system 400 and/or the surrounding environment). The lidar device 410 is depicted as separate from the sensors 412 for purposes of example, and may be considered as part of or as the sensors 412 in some examples.

Based on characteristics of the system 400 and/or the surrounding environment determined by the system controller 402 based on the outputs from the lidar device 410 and the sensors 412, the system controller 402 may control the controllable components 414 to perform one or more actions. For example, the system 400 may correspond to a vehicle, in which case the controllable components 414 may include a braking system, a turning system, and/or an accelerating system of the vehicle, and the system controller 414 may change aspects of these controllable components based on characteristics determined from the lidar device 410 and/or sensors 412 (e.g., when the system controller 402 controls the vehicle in an autonomous mode). Within examples, the lidar device 410 and the sensors 412 are also controllable by the system controller 402.

Figure 4B:
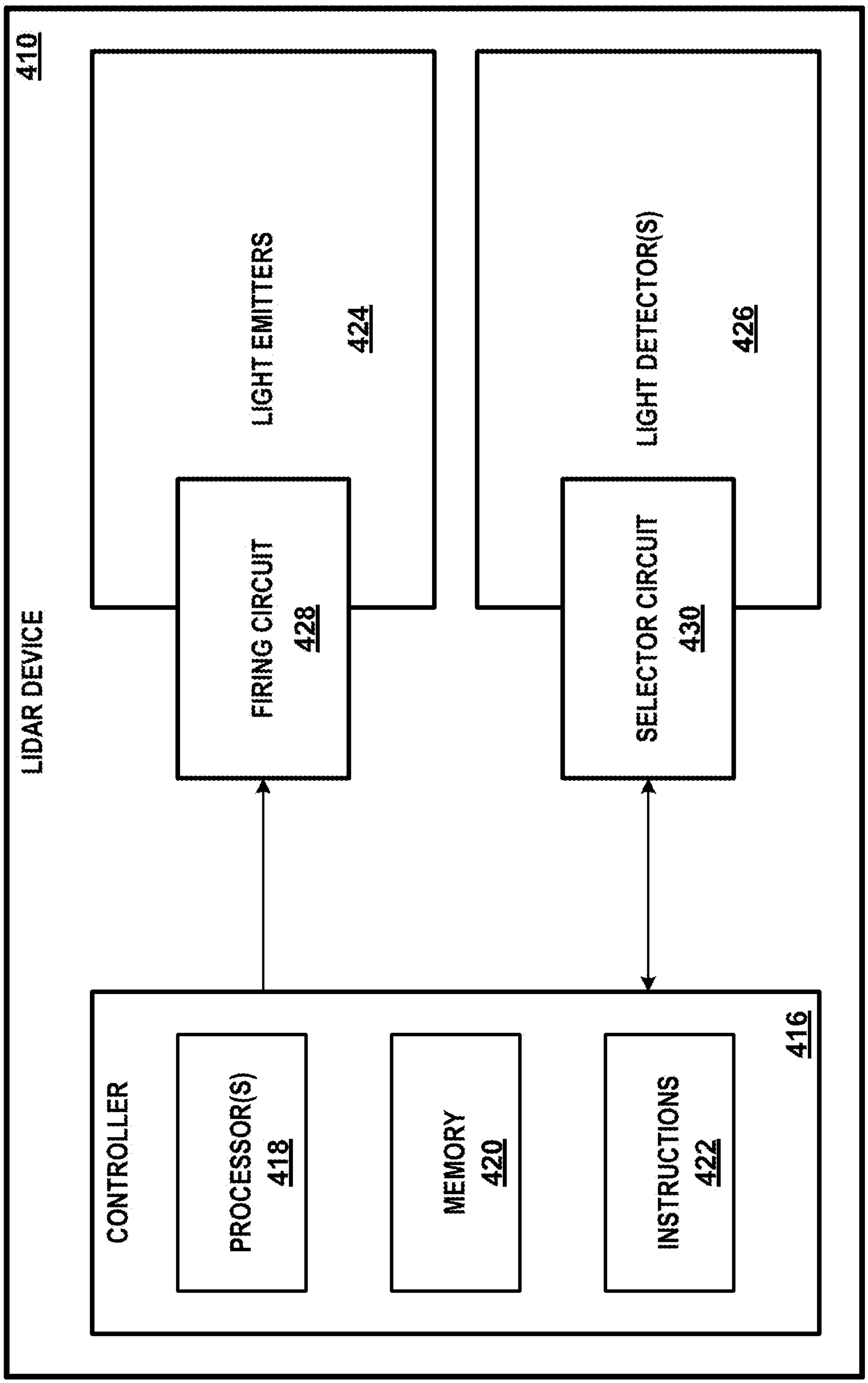
FIG. 4B is a block diagram of a lidar device, according to example embodiments.

FIG. 4B is a block diagram of a lidar device, according to an example embodiment. In particular, FIG. 4B shows a lidar device 410, having a controller 416 configured to control a plurality of light emitters 424 and one or more light detector(s), e.g., a plurality of light detectors 426. The lidar device 410 further includes a firing circuit 428 configured to select and provide power to respective light emitters of the plurality of light emitters 424 and may include a selector circuit 430 configured to select respective light detectors of the plurality of light detectors 426. The controller 416 includes processor(s) 418, a memory 420, and instructions 422 stored on the memory 420.

Similar to processor(s) 404, the processor(s) 418 can include one or more processors, such as one or more general-purpose microprocessors and/or one or more special purpose microprocessors. The one or more processors may include, for instance, an application-specific integrated circuit (ASIC) or a field-programmable gate array (FPGA). Other types of processors, computers, or devices configured to carry out software instructions are contemplated herein.

Similar to memory 406, the memory 420 may include a computer-readable medium, such as a non-transitory, computer-readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The instructions 422 are stored on memory 420 and executable by the processor(s) 418 to perform functions related to controlling the firing circuit 428 and the selector circuit 430, for generating 3D point cloud data, and for processing the 3D point cloud data (or perhaps facilitating processing the 3D point cloud data by another computing device, such as the system controller 402).

The controller 416 can determine 3D point cloud data by using the light emitters 424 to emit pulses of light. A time of emission is established for each light emitter and a relative location at the time of emission is also tracked. Aspects of a surrounding environment of the lidar device 410, such as various objects, reflect the pulses of light. For example, when the lidar device 410 is in a surrounding environment that includes a road, such objects may include vehicles, signs, pedestrians, road surfaces, construction cones, or the like. Some objects may be more reflective than others, such that an intensity of reflected light may indicate a type of object that reflects the light pulses. Further, surfaces of objects may be at different positions relative to the lidar device 410, and thus take more or less time to reflect portions of light pulses back to the lidar device 410. Accordingly, the controller 416 may track a detection time at which a reflected light pulse is detected by a light detector and a relative position of the light detector at the detection time. By measuring time differences between emission times and detection times, the controller 416 can determine how far the light pulses travel prior to being received, and thus a relative distance of a corresponding object. By tracking relative positions at the emission times and detection times the controller 416 can determine an orientation of the light pulse and reflected light pulse relative to the lidar device 410, and thus a relative orientation of the object. By tracking intensities of received light pulses, the controller 416 can determine how reflective the object is. The 3D point cloud data determined based on this information may thus indicate relative positions of detected reflected light pulses (e.g., within a coordinate system, such as a Cartesian coordinate system) and intensities of each reflected light pulse.

As described further below, the firing circuit 428 is used for selecting light emitters for emitting light pulses. The selector circuit 430 similarly is used for sampling outputs from light detectors.

Figure 5A:
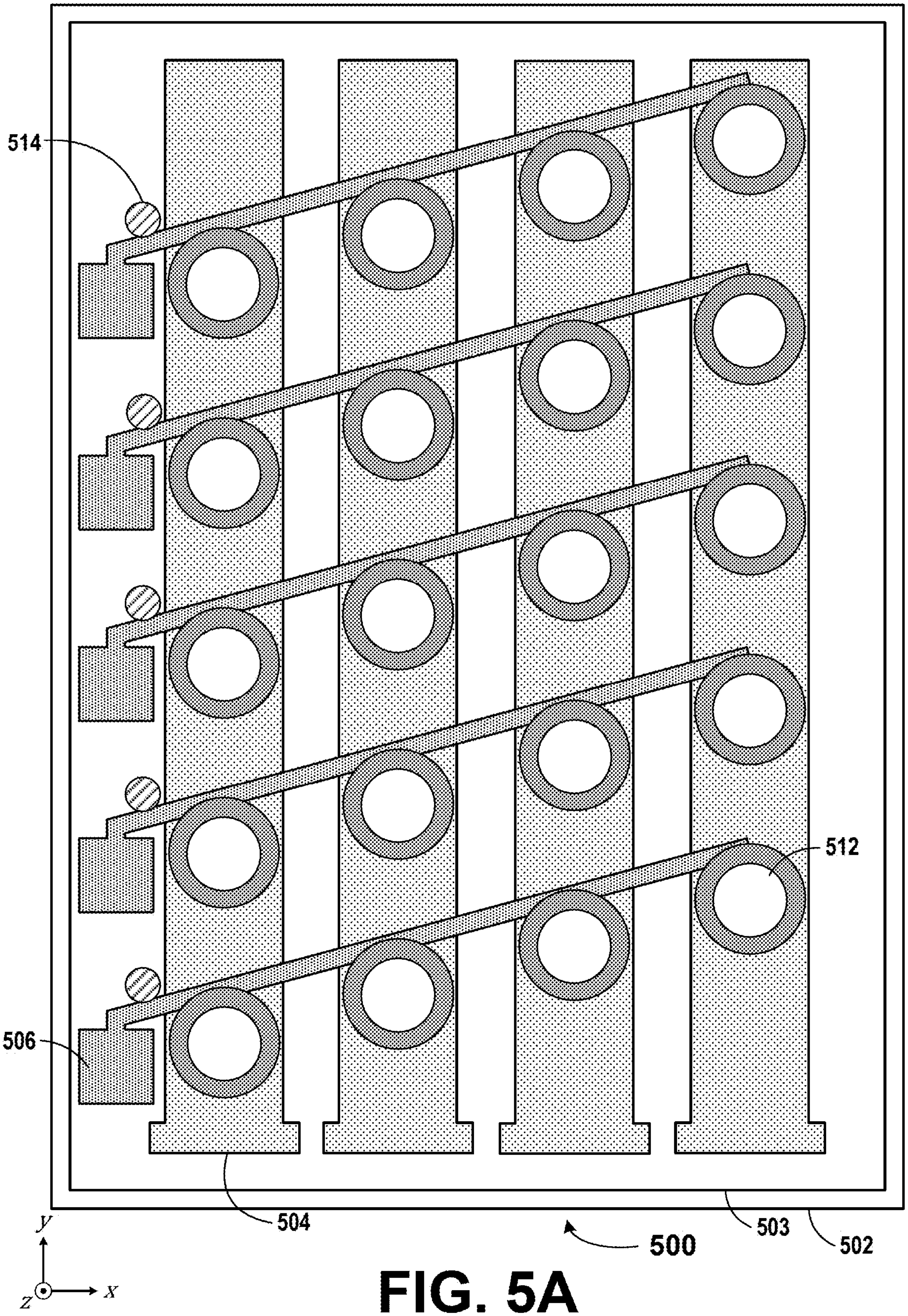
FIG. 5A is a top-view illustration of an array of VCSELs, according to example embodiments.

FIG. 5A is a top-view illustration of an array of VCSELs 500, according to example embodiments. The array of VCSELs 500 may represent the light emitters in a lidar device (e.g., the lidar unit 128 illustrated in FIG. 1, the first lidar unit 204 illustrated in FIGS. 2A-3, the second lidar unit 206 illustrated in FIGS. 2A-2E, or the lidar device 410 illustrated in FIGS. 4A and 4B), for example. In some embodiments, the array of VCSELs 500 may be connected to a firing circuit (e.g., as illustrated in FIGS. 5C and 5D). Further, a lidar device of which the array of VCSELs 500 is a component may include one or more controllers (e.g., to send control signals for the array of VCSELs 500 to the firing circuit) and/or detectors (e.g., detectors configured to detect light pulses emitted by the array of VCSELs 500 upon the light pulses being reflected by objects in an environment surrounding the lidar device), in various embodiments. As illustrated, the array of VCSELs 500 may include the VCSELs 512 themselves, a shared substrate 502, an isolation layer 503, cathodes 504, anodes 506, and associated capacitors 514.

The shared substrate 502 illustrated in FIG. 5A may be a substrate on which each of the VCSELs 512 is fabricated. Further, the shared substrate 502 may be a substrate on which each of the cathodes 504, each of the anodes 506, and each of the associated capacitors 514 is defined. The shared substrate 502 may be between 100 μm and 150 μm (e.g., 120 μm) in thickness, for example. Other thicknesses are also possible. In some embodiments, the shared substrate 502 may be thinned after fabrication. This may allow for different emission wavelengths from the VCSELs 512, in some cases.

The isolation layer 503 illustrated in FIG. 5A may provide a separation between the cathodes 504/anodes 506 and the shared substrate 502. In this way, different cathodes 504 may be electrically isolated from one another (e.g., so that columns of cathodes 504 may be selected individually).

Figure 5B:
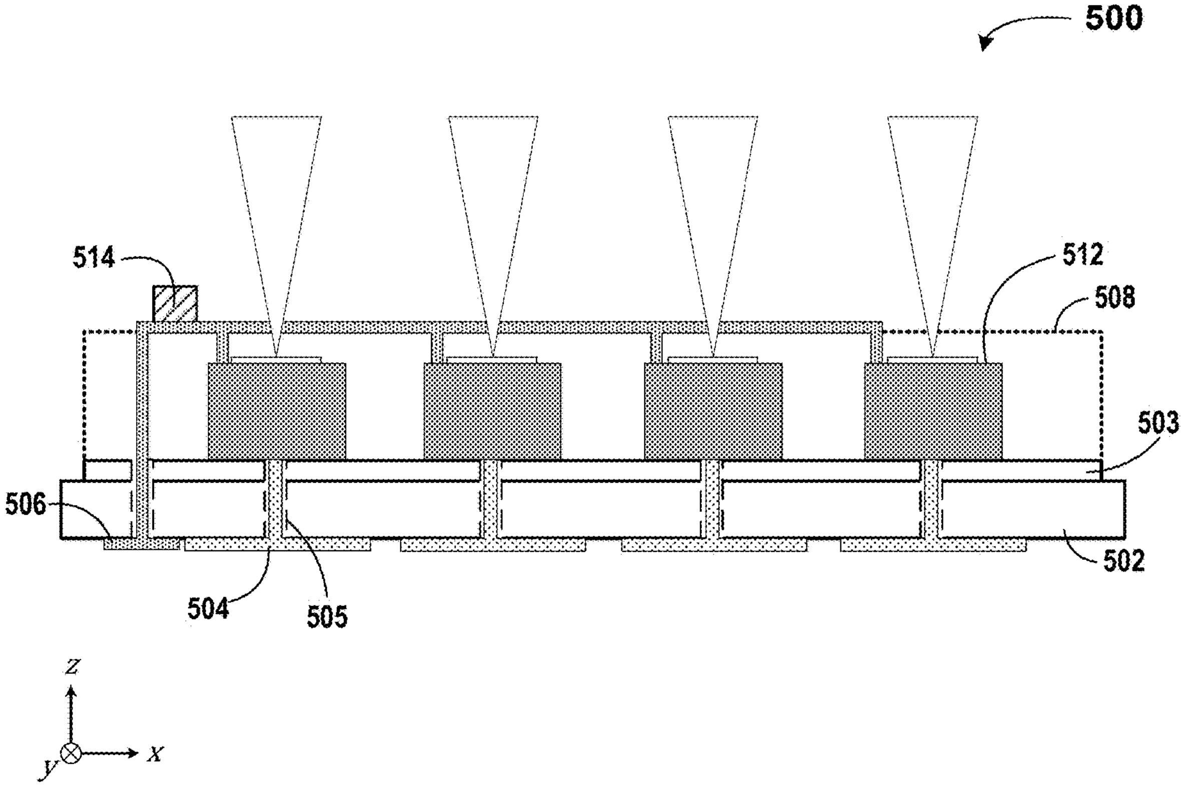
FIG. 5B is a cross-sectional side-view illustration of an array of VCSELs, according to example embodiments.
Figure 5C:
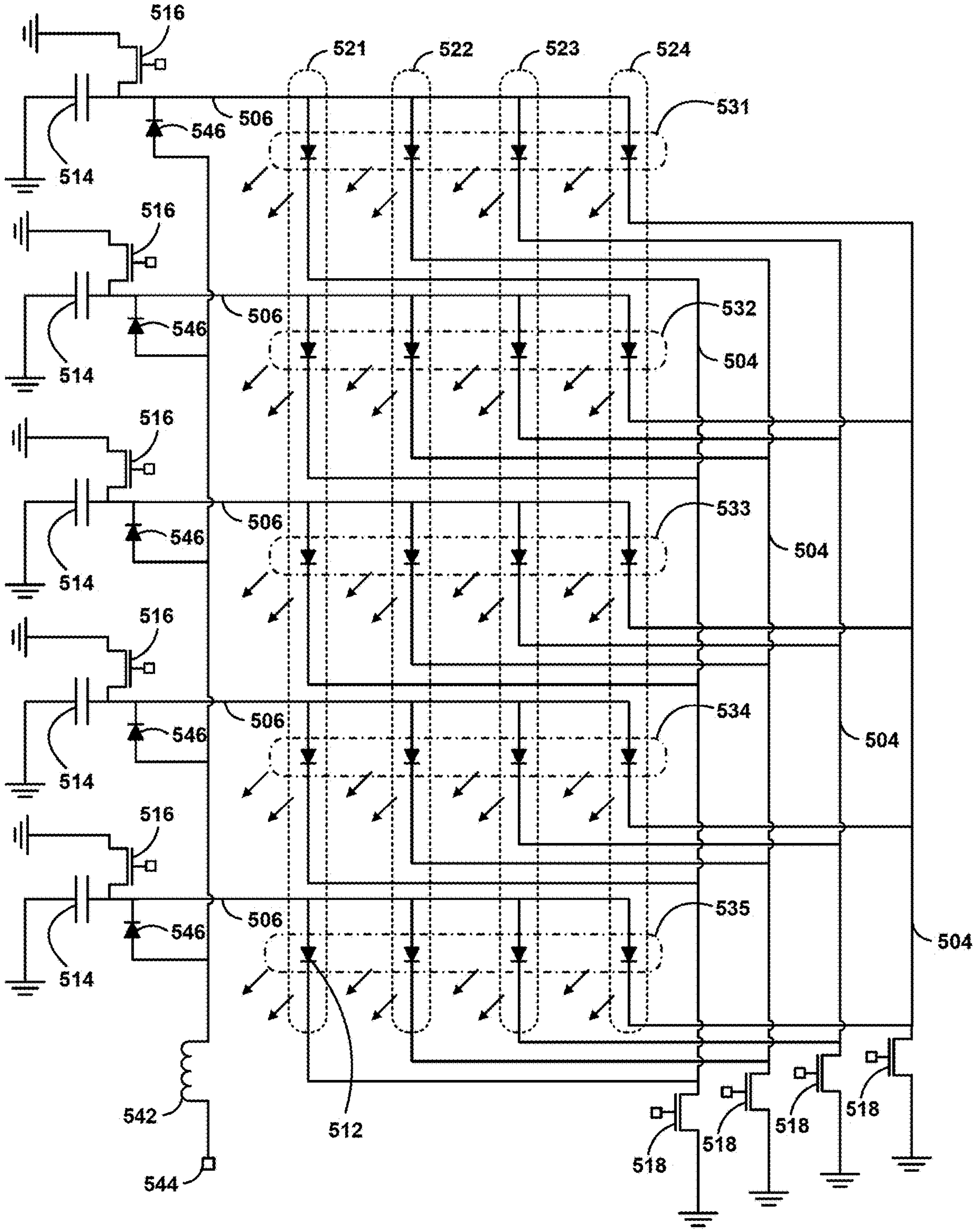
FIG. 5C is a schematic illustration of a firing circuit, according to example embodiments.
Figure 5D:
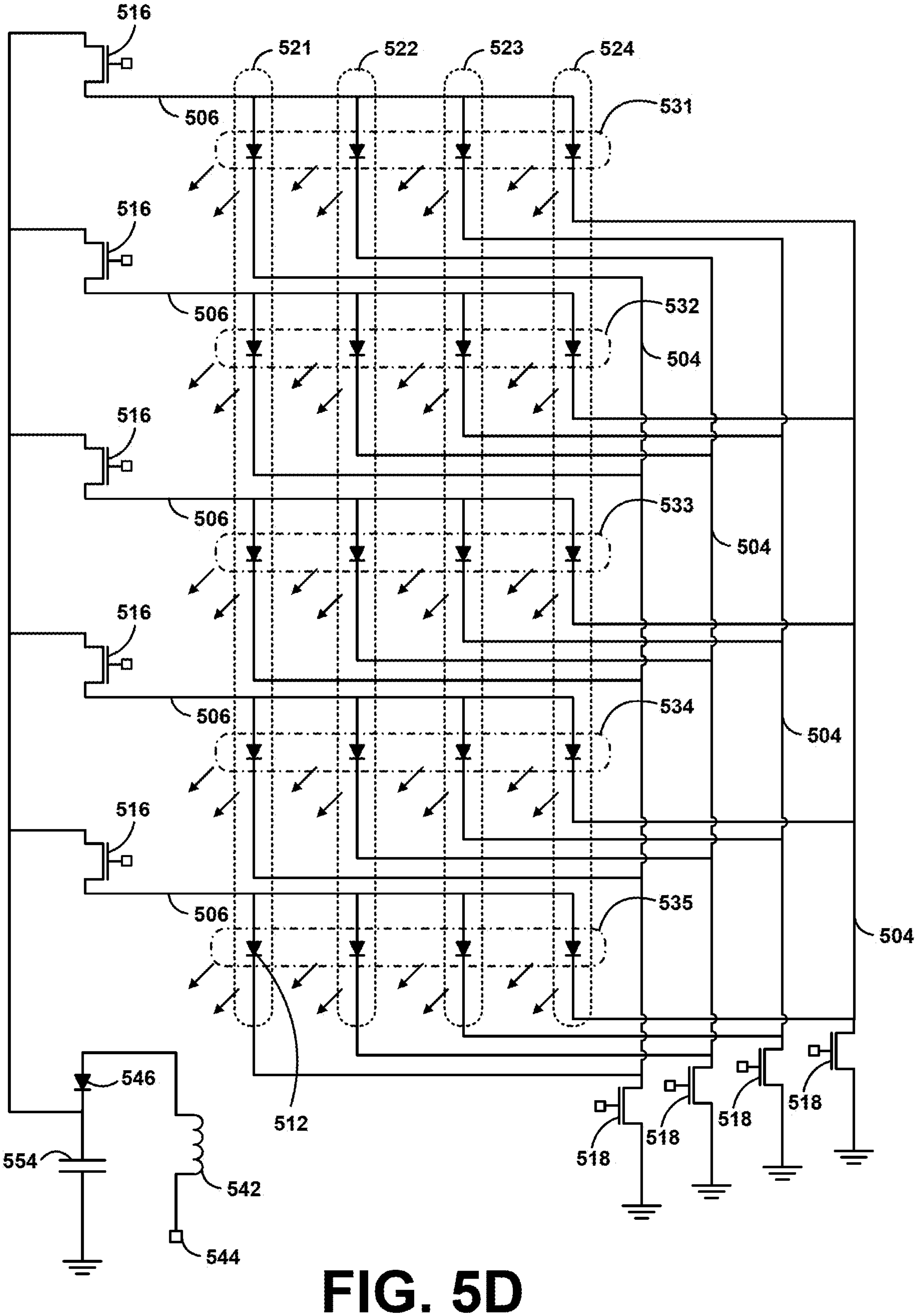
FIG. 5D is a schematic illustration of a firing circuit, according to example embodiments.

The VCSELs 512, the cathodes 504, the anodes 506, and/or the capacitors 514 may lie within a growth layer (as illustrated using reference numeral 508 in FIG. 5B). However, for illustration purposes only, in order to prevent occluding the components in FIG. 5A, the growth layer 508 is not pictured in the figure. Such a growth layer 508, when present, may be positioned above the shared substrate 502 (e.g., may be oriented parallel to the x-y plane and have a greater z-value than the top surface of the shared substrate 502).

The cathodes 504 illustrated in FIG. 5A may be used to discharge capacitors 514 through select VCSELs 512 to allow those VCSELs 512 to emit light pulses. As illustrated, each of the cathodes 504 may correspond to a column of VCSELs 512. Further, each of the cathodes 504 corresponds to a single column of VCSELs 512, meaning that each of the VCSELs 512 in a given column shares a common cathode 504 with all other VCSELs 512 in that column.

The anodes 506 illustrated in FIG. 5A may be used to discharge capacitors 514 through select VCSELs 512 to allow those VCSELs 512 to emit light pulses. As illustrated, each of the anodes 506 may correspond to a row of VCSELs 512. Further, each of the anodes 506 corresponds to a single row of VCSELs 512, meaning that each of the VCSELs 512 in a given row shares a common anode 506 with all other VCSELs 512 in that row.

While the anodes 506 correspond to rows of VCSELs 512 and cathodes 504 correspond to columns of VCSELs 512 in FIG. 5A, it is understood that this is provided solely as an example. In other embodiments, the cathodes 504 and anodes 506 of the array 500 could be switched (i.e., the cathodes could instead correspond to rows of VCSELs and the anodes could correspond to columns of VCSELs).

The VCSELs 512 illustrated in FIG. 5A may be between 20 μm and 40 μm in diameter (e.g., 30 μm) in the x-y plane illustrated in FIG. 5A. Such a diameter may represent the diameter of the emission surface of the VCSELs 512 in some embodiments and/or the diameter of the entire VCSELs 512. Further, in some embodiments, the diameter of the emission surface of the VCSELs 512 may be the same as the diameter of the entire VCSELs 512.

As illustrated, the VCSELs 512 may be disposed on the shared substrate 502. Further, the optical cavities of the VCSELs 512 may be oriented in a normal direction relative to a surface of the shared substrate 502 (e.g., the +z-direction, as illustrated in FIG. 5A). In addition, the VCSELs 512 may emit light pulses from the top-sides of the VCSELs 512 (e.g., the sides with the greatest z-values). These top-sides of the VCSELs 512 may be opposite the side of the VCSELs 512 that is on the surface of the shared substrate 502. Hence, light pulses emitted by the VCSELs 512 may not pass through the shared substrate prior to being transmitted to the environment surrounding the lidar device. In other words, the VCSELs 512 illustrated in FIG. 5A may be referred to as "top-emitting" VCSELs.

In some embodiments, the VCSELs 512 may emit light pulses having wavelengths between 850 nm and 940 nm (e.g., 905 nm). The emission wavelength may be tuned based on the design of the cavities and the gain media of the VCSELs 512, for example. In some embodiments, the VCSELs 512 may be GaAs VCSELs.

The VCSELs 512 illustrated in FIG. 5A each have the same diameter in the x-y plane. It is understood that this is provided solely as an example and that other variations are possible and contemplated herein. In some embodiments, the VCSELs 512 in the array may have at least two different form factors. For example, different VCSELs 512 in the array 500 could have different diameters from one another. A first set of VCSELs 512 in the array 500 may have a first diameter (e.g., based on a first form factor) that is greater than a second diameter (e.g., based on a second form factor) of a second set of VCSELs 512 in the array 500. As such, the VCSELs 512 in the first set of VCSELs may be configured to emit light pulses that have a higher power than the light pulses emitted by the VCSELs 512 in the second set of VCSELs 512. Other variations in form factor are also possible.

As also illustrated in FIG. 5A, the VCSELs 512 in the array 500 may be arranged into sets of rows and columns of VCSELs 512. Note that the VCSELs 512 within the same row, as illustrated, may have slightly different y-positions. This may allow for a wider variety of elevation angles, for example, when firing using the array 500 to produce light pulses to identify distances to objects in a surrounding environment. As illustrated, there may be five rows of VCSELs 512 and four columns of VCSELs 512. This is provided solely as an example and other numbers of rows and columns are possible and contemplated herein (e.g., tens, hundreds, or thousands of rows and/or tens, hundreds, or thousands of columns).

Further, the spacing between adjacent rows and adjacent columns may be consistent across the array 500. For example, the spacing between adjacent columns of VCSELs 512 may be between 110 μm and 130 μm (e.g., 120 μm) and the spacing between adjacent rows of VCSELs 512 may be between 90 μm and 110 μm (e.g., 100 μm). FIG. 5A is provided solely as an example embodiment, however. In other embodiments, the spacing may be unequal, non-uniform, or even irregular. For example, a non-uniform pattern may be used to account for optical distortion in other components of a lidar device of which the array 500 is a component (e.g., a lens or mirror of the associated lidar device). Such unequal spacing may be designed based on previous distortion measurements and/or optical characterizations made of other components of the lidar device, in some embodiments. In still other embodiments, the VCSELs 512 may not be arranged in a row/column (i.e., rectangular) fashion. For example, the VCSELs 512 may be arranged in a hexagonal pattern. Further, in some embodiments, the hexagonal pattern may be sparse in comparison to sizes of emission surfaces of the VCSELs 512 (e.g., the spacing between adjacent VCSELs 512 may be at least ten times greater than the diameter of the VCSELs 512).

The capacitors 514 illustrated in FIG. 5A may store electrical energy that can be discharged through the VCSELs 512 such that the VCSELs 512 emit light pulses. Using switches (e.g., as illustrated the firing circuitry of FIGS. 5C and 5D), the capacitors 514 can be selectively charged and discharged and/or selectively connected to the anodes 506 and/or cathodes 504 illustrated in FIG. 5A. This may allow a controller of a lidar device to selectively fire one or more of the VCSELs 512 in the array 500. Such a selective firing may be based on one or more control signal(s) received by a firing circuit from the controller. For example, by selecting a single row of VCSELs 512 and a single column of VCSELs 512, a controller could individually address a single VCSEL 512 in the array 500.

FIG. 5B is a cross-sectional side-view illustration of an array of VCSELs (e.g., the array of VCSELs 500 illustrated in FIG. 5A), according to example embodiments. Some portions of the array 500 may be removed in the figure so as to not occlude other features. For example, as illustrated, there is a growth layer 508 on top of the shared substrate 502. The VCSELs 512 are disposed within the growth layer 508. So as not to occlude visibility of the VCSELs 512, the growth layer 508 has been cut away to reveal the VCSELs 512. This is illustrated in the drawing by illustrating the edges of the growth layer 508 using dashed lines. As described with reference to FIG. 5A, and illustrated here in FIG. 5B, the VCSELs 512 are configured to emit light upward in a direction opposite the shared substrate 502. In other words, the VCSELs 512 illustrated here are top-emitting VCSELs.

As illustrated in FIG. 5B, the isolation layer 503 may provide isolation among the various cathodes 504 of the various VCSELs 512. Further, as illustrated, the isolation layer 503 and the shared substrate 502 may have one or more vias 505 defined therein. The vias may allow for electrical connections to the anodes 506 and/or cathodes 504 to be made at a surface (e.g., a bottom surface, i.e., a surface having the lowest z position) of the shared substrate 502. Hence, the vias 505 may allow for electrical control of the VCSELs 512 in a manner that is isolated between VCSELs 512 and allows individual addressability.

It is understood that, while only one row of VCSELs 512 is illustrated in FIG. 5B, other rows may also be present within the embodiment of FIG. 5B (e.g., there may be five rows of VCSELs 512 and four columns of VCSELs 512, as illustrated in FIG. 5A). It is also understood that the embodiment illustrated in FIG. 5B is provided by way of example and that other embodiments are possible. For example, in some embodiments, there may not be a growth layer 508 (e.g., the growth layer may be etched back or otherwise removed). Further, components illustrated as being within the growth layer 508 (e.g., the VCSELs 512, the cathodes 504, the anode 506, etc.) may be positioned partially or wholly adjacent to the growth layer, instead. Likewise, while the capacitor 514 is illustrated as being disposed above the growth layer 508, in some embodiments, the capacitor 514 may instead be disposed partially or wholly inside the growth layer or adjacent to the growth layer 508 in the x-y plane. In still other embodiments, some components (e.g., the capacitor 514) may be separated entirely from the array 500 of VCSELs and electrically connected to the array 500 from a distance (e.g., using a wire trace on a printed circuit board (PCB)).

FIG. 5C is a schematic illustration of a firing circuit, according to example embodiments. The firing circuit illustrated in FIG. 5C may be used to fire an array of VCSELs (e.g., the array of VCSELs 500 illustrated in FIGS. 5A and 5B). Hence, as illustrated in FIG. 5C, the components of the array of VCSELs 500 illustrated in FIGS. 5A and 5B have been attached to the firing circuit of FIG. 5C. It is understood that this is for illustrative purposes only, and that the firing circuit of FIG. 5C may equally be used with other arrays of VCSELs or other types of light emitters, as well. The firing circuit includes the cathodes 504, the anodes 506, the VCSELs 512, the capacitors 514, row switches 516 associated with rows of VCSELs 531, 532, 533, 534, 535, column switches 518 associated with columns of VCSELs 521, 522, 523, 524, an inductor 542 for charging the capacitors 514, a voltage source node 544 for charging the capacitors 514, and charging diodes 546. The columns of VCSELs 521, 522, 523, 524 may correspond to physical arrangements of columns of VCSELs 512 (e.g., the columns illustrated in FIG. 5A), for example. Similarly, the rows of VCSELs 531, 532, 533, 534, 535 may correspond to physical arrangements of rows of VCSELs 512 (e.g., the rows illustrated in FIG. 5A).

In some embodiments, the firing plan for the VCSELs 512 may include one or more charging stages (used to charge the capacitors 514) followed by one or more firing stages (used to emit light pulses from the VCSELs 512). Further, in some embodiments, the columns 521, 522, 523, 524 of VCSELs 512 may be fired sequentially during the firing stage(s). For example, the first column 521 of VCSELs 512 may be fired before the second column 522 of VCSELs 512, which is fired before the third column 523 of VCSELs 512, which is fired before the fourth column 524 of VCSELs 512. This may allow for a greater selectivity of individual VCSELs 512 using the row-anode/column-cathode arrangement illustrated (e.g., this may provide for individual addressability of each VCSEL 512 in the array 500).

The voltage source node 544 may provide electrical energy to the capacitors 514 through the diodes 546 and the inductor 542 during one or more charging stages of the firing circuit. For example, the voltage source node 544 may be connected to a power supply of the lidar device (e.g., a direct current (DC) power supply, such as a battery). The row switches 516 may be used to select which of the capacitors 514 get charged. For example, during a charging stage, the row switches 516 may be open such that each of the capacitors 514 may be charged by the voltage source node 544 through the inductor 542 and the respective diodes 546. Then, prior to any firing stage(s), any of the row switches 516 may be closed such that the respective capacitors 514 are discharged to ground. This would prevent the row of VCSELs 512 corresponding to those capacitors 514 from having any energy to emit light pulses during subsequent firing stage(s), until the next charging stage occurs (when the capacitor 514 will have another opportunity to charge). Likewise, the capacitors 514 corresponding to any row switches 516 that are not closed prior to any firing stage(s) may represent those rows 531, 532, 533, 534, 535 of VCSELs 512 that have been selected to fire.

Thereafter, one or more of the column switches 518 may be closed during one or more firing stage(s) to determine which column(s) 521, 522, 523, 524 are selected to fire. Similarly, the column switches 518 may remain open during a firing stage corresponding to the given column 521, 522, 523, 524 associated with the respective column switch 518. This may leave an open circuit and, thereby, prevent the associated VCSELs 512 in that column from firing.

The row switches 516 and the column switches 518 may be electrically coupled to and/or controlled by a controller of the associated lidar device, in some embodiments. For example, the row switches 516 and column switches 518 may be controlled by one or more control signal(s) transmitted from the controller to the firing circuit. Further, in some embodiments, the row switches 516 and/or the column switches 518 could be controlled by a shift register that is loaded with different bits for each switch at different times based on one or more control signals from a controller.

In some embodiments, the row switches 516 and the column switches 518 may be transistors (e.g., field-effect transistors (FETS) or bipolar junction transistors (BJTs)). For example, the row switches 516 and column switches 518 may be gallium nitride field-effect transistors (GaNFETs). Other types of row switches 516 and/or column switches 518 could also be used and are contemplated herein.

As illustrated in FIG. 5C, there is one capacitor 514 associated with each row 531, 532, 533, 534, 535 of VCSELs 512. In other embodiments, there may be different numbers of capacitors 514. For example, there may be a single capacitor (or single bank of capacitors) used to power every VCSEL 512 in the array 500. Such an embodiment is shown and described with reference to FIG. 5D.

FIG. 5D is a schematic illustration of a firing circuit, according to example embodiments. The firing circuit illustrated in FIG. 5D may be used to fire an array of VCSELs (e.g., the array of VCSELs 500 illustrated in FIGS. 5A and 5B). Hence, as illustrated in FIG. 5D, some of the components of the array of VCSELs 500 illustrated in FIGS. 5A and 5B have been attached to the firing circuit of FIG. 5D. Unlike the array 500 illustrated in FIG. 5A, though, the array being fired in FIG. 5D only includes one capacitor 554 for the entire array. It is understood that the inclusion of many of the components from the array 500 illustrated in FIG. 5A is provided for illustrative purposes only, and that the firing circuit of FIG. 5D may equally be used with other arrays of VCSELs or other types of light emitters, as well. The firing circuit includes the cathodes 504, the anodes 506, the VCSELs 512, row switches 516 associated with rows of VCSELs 531, 532, 533, 534, column switches 518 associated with columns of VCSELs 521, 522, 523, 524, a capacitor 554 for firing the VCSELs 512, an inductor 542 for charging the capacitor 554, a voltage source node 544 for charging the capacitor 554, and a charging diode 546.

The firing circuit of FIG. 5D functions similarly to the firing circuit of FIG. 5C. However, unlike FIG. 5C, the array only includes a single capacitor 554. As such, the capacitance of the capacitor 554 may be many times the capacitance of the individual capacitors 514 illustrated in FIG. 5C. Like FIG. 5C, though, there are row switches 516 that control the firing of each row. However, in FIG. 5D, the row switches 516 control the firing by connecting the rows of VCSELs 531, 532, 533, 534, 535 to the capacitor 554 during the firing stages (as opposed to shorting the capacitors during charging stages as in FIG. 5C). During the charging stage(s) of the firing circuit illustrated in FIG. 5D, the capacitor 554 will be charged by the voltage source node 544 through the inductor 542 and the charging diode 546. It is then a matter which of the row switches 516 and column switches 518 are closed during the firing stages that determines which of the VCSELs 512 emit light pulses. As noted above, the row switches 516 and column switches 518 may be transistors (e.g., GaNFETs) and/or may be controlled by a controller of the lidar device using control signal(s).

Figure 5E:
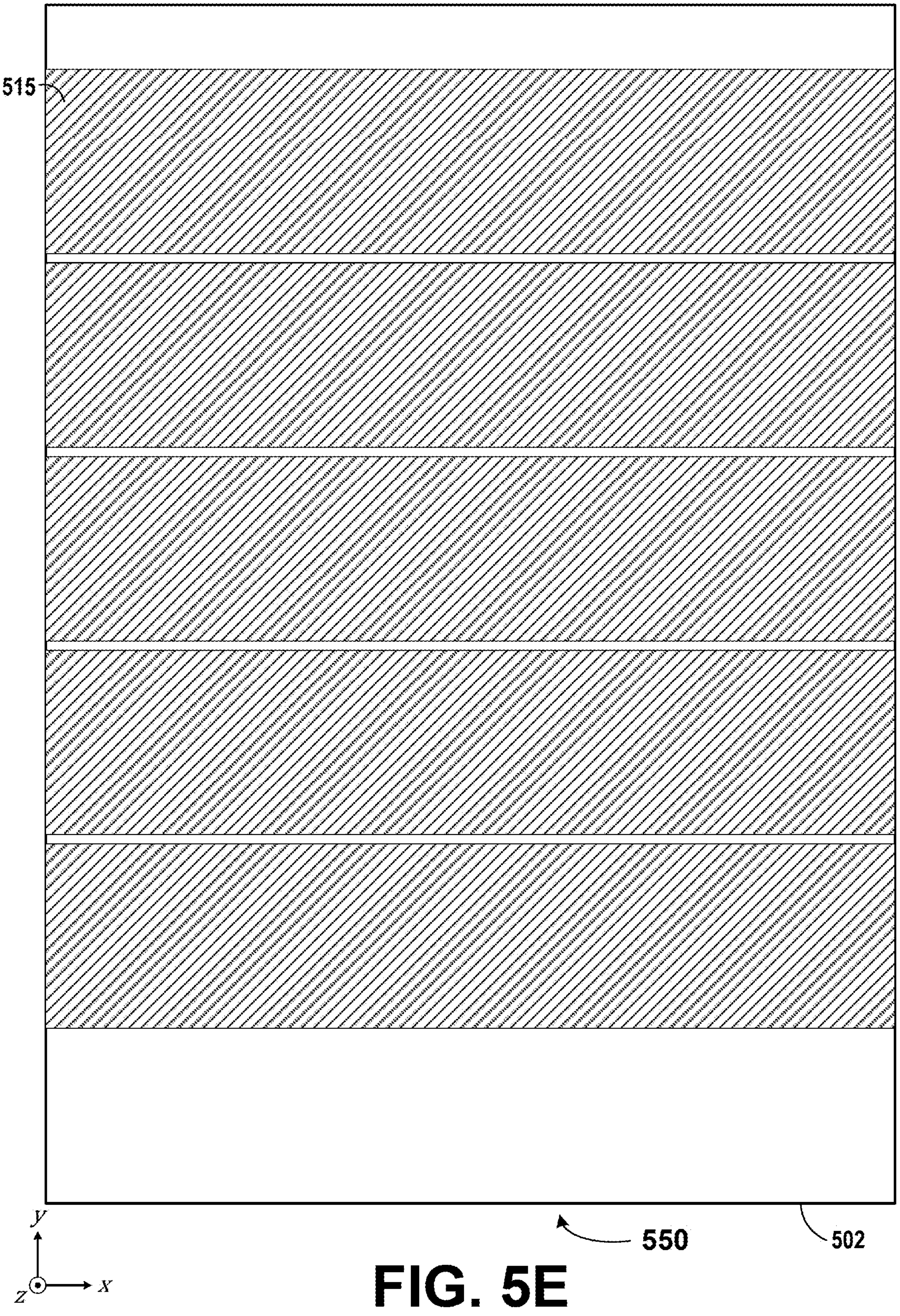
FIG. 5E is a top-view illustration of an array of VCSELs, according to example embodiments.

FIG. 5E is a top-view illustration of an array of VCSELs 550, according to example embodiments. The array of VCSELs 550 may be the same as the array of VCSELs 500 illustrated in FIG. 5A. For example, the array of VCSELs 550 may include the VCSELs 512 themselves, a shared substrate 502, an isolation layer 503, cathodes 504, and anodes 506. For the purposes of illustration, the isolation layer 503, cathodes 504, and anodes 506 have been removed from FIG. 5E. Unlike the array of VCSELs 500 illustrated in FIG. 5A, however, the array of VCSELs 550 illustrated in FIG. 5E may have associated capacitors 515 that correspond to planar layers adjacent to or incorporated with the shared shared substrate 502 (rather than discrete components as illustrated in FIG. 5A). As illustrated in FIG. 5E, there may be multiple associated capacitors 515 (e.g., one associated capacitor 515 for each anode 506).

Figure 5F:
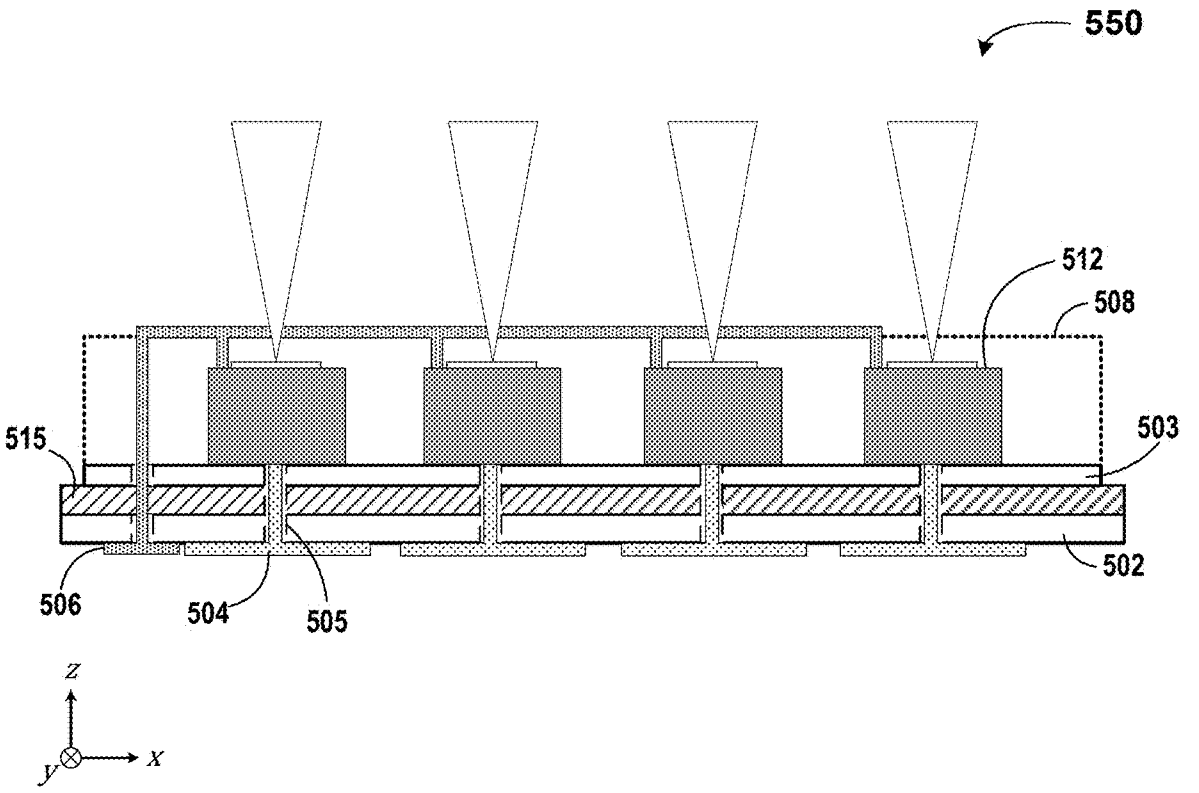
FIG. 5F is a cross-sectional side-view illustration of an array of VCSELs, according to example embodiments.

FIG. 5F illustrates the array of VCSELs 550 of FIG. 5E from a side-view. Unlike FIG. 5E, the isolation layer 503, the cathodes 504, and the anodes 506 are illustrated in FIG. 5F. In some embodiments, the firing circuit used to fire the array of VCSELs 550 may be the same firing circuit illustrated in FIG. 5C or the same as the firing circuit illustrated in FIG. 5D. However, in some embodiments, alternative firing circuits may be used (e.g., to accommodate differences in the geometry of the array of VCSELs 550 relative to the array of VCSELs 500)

The array of VCSELs 550 illustrated in FIGS. 5E and 5F may have a reduced overall volume relative to the array of VCSELs 500 illustrated in FIGS. 5A and 5B and/or may require fewer fabrication steps to make. While the array of VCSELs 550 illustrated in FIGS. 5E and 5F correspond to an array of top-emitting VCSELs, it is understood that bottom-emitting VCSELs (e.g., as shown and described with reference to FIG. 6A) could also be used with alternative associate capacitors 515 of FIGS. 5E and 5F.

Figure 6A:
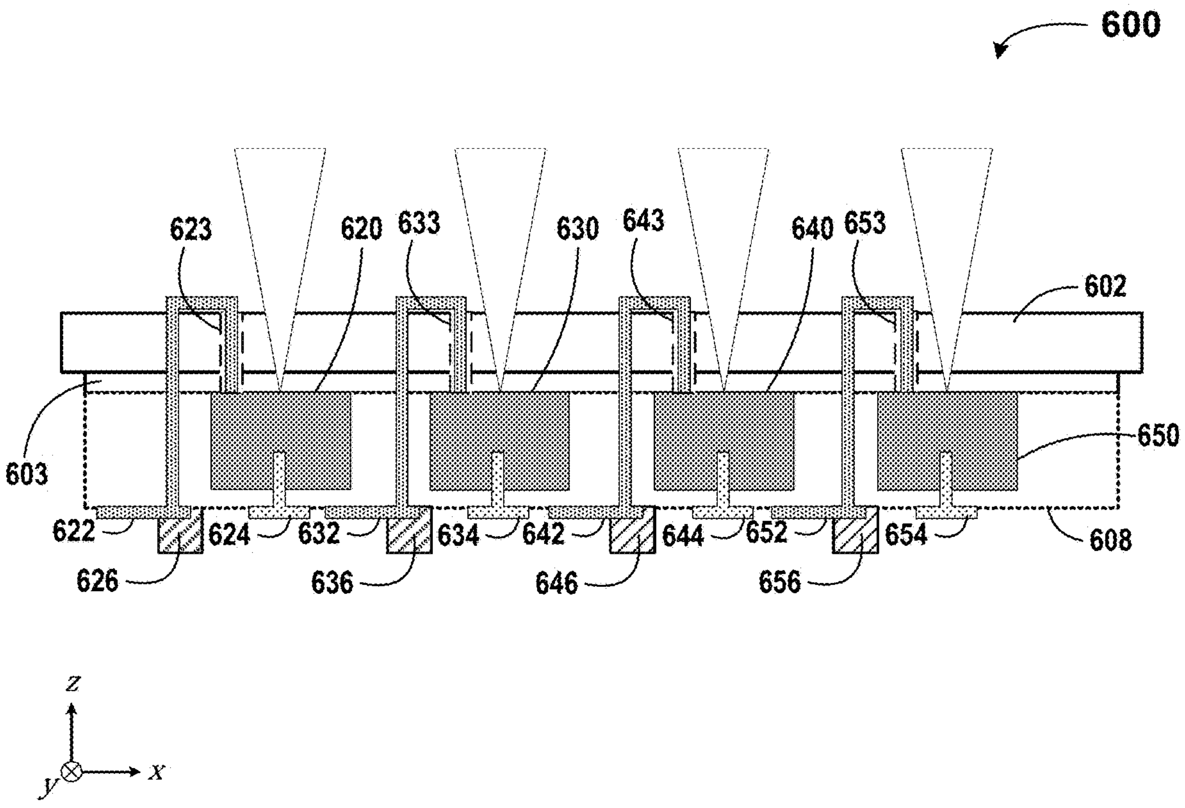
FIG. 6A is a cross-sectional side-view illustration of an array of VCSELs, according to example embodiments.
Figure 6B:
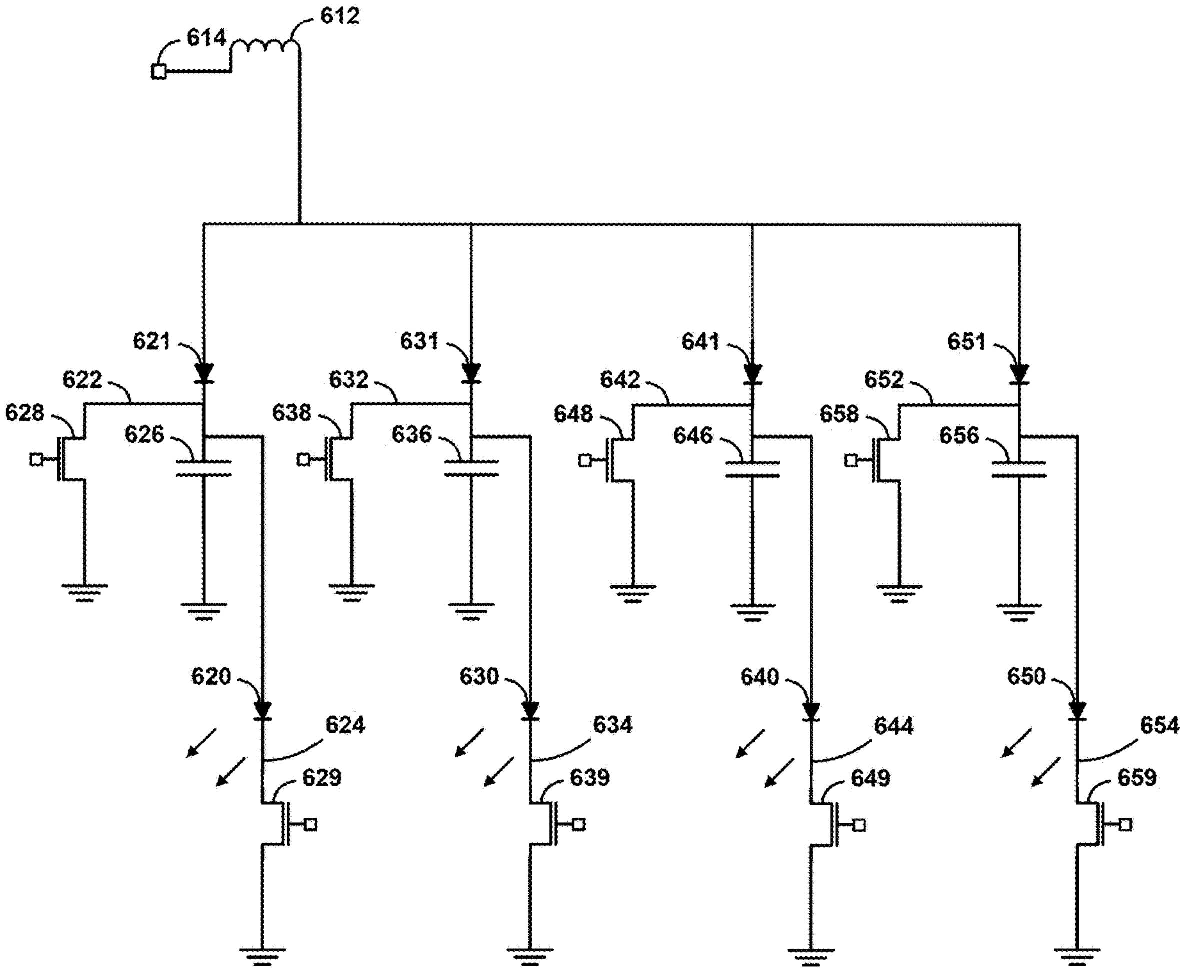
FIG. 6B is a schematic illustration of a firing circuit, according to example embodiments.

FIG. 6A is a cross-sectional side-view illustration of an array of VCSELs 600, according to example embodiments. The array of VCSELs 600 may represent the light emitters in a lidar device (e.g., the lidar unit 128 illustrated in FIG. 1, the first lidar unit 204 illustrated in FIGS. 2A-3, the second lidar unit 206 illustrated in FIGS. 2A-2E, or the lidar device 410 illustrated in FIGS. 4A and 4B), for example. In some embodiments, the array of VCSELs 600 may be connected to a firing circuit (e.g., as illustrated in FIG. 6B). Further, a lidar device of which the array of VCSELs 600 is a component may include one or more controllers (e.g., to send control signals for the array of VCSELs 600 to the firing circuit) and/or detectors (e.g., detectors configured to detect light pulses emitted by the array of VCSELs 600 upon the light pulses being reflected by objects in an environment surrounding the lidar device), in various embodiments. As illustrated, the array of VCSELs 600 may include the VCSELs 620, 630, 640, 650 themselves, a shared substrate 602, an isolation layer 603, a growth layer 608, cathodes 624, 634, 644, 654, anodes 622, 632, 642, 652, vias 623, 633, 643, 653, and associated capacitors 626, 636, 646, 656. Similar to the growth layer 508 illustrated in FIG. 5B, the growth layer 608 of FIG. 6A has been cut away so as not to occlude the remainder of the figure. The dashed line at the edges of the growth layer 608 is meant to indicate that the growth layer 608 has been partially removed.

Similar to the array 500 of FIGS. 5B, the array 600 illustrated in FIG. 6A only includes four VCSELs 620, 630, 650, 650. This may represent one of many rows of VCSELs in the array 600. For example, the array 600 may include five rows of four VCSELs each, like the array 500 illustrated in FIG. 5A. Further, the embodiment provided in FIG. 6A is solely provided as an example. It is understood that other numbers and arrangements of VCSELs are also possible. For example, each row may have a different number of VCSELs, each column may have a different number of VCSELs, there may be a different number of rows and/or columns, and/or the VCSELs may not be organized in a row-column arrangement at all.

Unlike the array 500 illustrated in FIGS. 5A and 5B, though, the array 600 of FIG. 6A is arranged with the shared substrate 602 above the VCSELs 620, 630, 640, 650 (i.e., the shared substrate 602 is at a greater z-position, as illustrated, than the VCSELs 620, 630, 640, 650). Like the VCSELs 512 in FIGS. 5A and 5B, the VCSELs 620, 630, 640, 650 in FIG. 6B have optical cavities oriented in a direction normal relative to the surface of the shared substrate 602. However, unlike the VCSELs 512 illustrated in FIGS. 5A and 5B, though, the VCSELs 620, 630, 640, 650 illustrated in FIG. 6A emit light pulses from bottom sides of the VCSELs 620, 630, 640, 650 such that the light pulses pass through the shared substrate 602 prior to being transmitted to the environment surrounding the lidar device. In other words, the VCSELs 620, 630, 640, 650 illustrated in FIG. 6A are "bottom-emitting" VCSELs. Further, the VCSELs 620, 630, 640, 650 may emit light at wavelengths greater than or equal to 940 nm (e.g., at 940 nm), in various embodiments.

Further, unlike the array 500 illustrated in FIGS. 5A and 5B, the VCSELs 620, 630, 640, 650 in the array 600 of FIG. 6A each have separate anodes 622, 632, 642, 652, separate cathodes 624, 634, 644, 654, and separate capacitors 626, 636, 646, 656 from one another. This allows the VCSELs 620, 630, 640, 650 to be individually addressable. Further, the VCSELs 620, 630, 640, 650 may be controlled with independent control signals from a controller of the lidar device, in some embodiments.

FIG. 6B is a schematic illustration of a firing circuit, according to example embodiments. The firing circuit illustrated in FIG. 6B may be used to fire an array of VCSELs (e.g., an array 600 of bottom-emitting VCSELs as illustrated in FIG. 6A). Hence, as illustrated in FIG. 6B, the components of the array 600 illustrated in FIG. 6A have been attached to the firing circuit of FIG. 6B. It is understood that this is for illustrative purposes only, and that the firing circuit of FIG. 6B may equally be used with other arrays of VCSELs or other types of light emitters, as well. The firing circuit includes the VCSELs 620, 630, 640, 650, the anodes 622, 632, 642, 652, the cathodes 624, 634, 644, 654, charging diodes 621, 631, 641, 651, anode switches 628, 638, 648, 658, the capacitors 626, 636, 646, 656, cathode switches 629, 639, 649, 659, an inductor 612 for charging the capacitors 626, 636, 646, 656, and a voltage source node 614 for charging the capacitors 626, 636, 646, 656. Similar to above, the voltage source node 614 may represent a power supply (e.g., a DC power supply, such as a battery) of the lidar device.

As noted above, while only four VCSELs 620, 630, 640, 650 have been illustrated in FIGS. 6A and 6B, other numbers of VCSELs 620, 630, 640, 650 in the array are also possible. If other numbers of VCSELs 620, 630, 640, 650 were present, the firing circuit could be adjusted to accommodate this (e.g., by including more cathodes, anodes, cathode switches, anode switches, etc.).

Unlike the firing circuits of FIGS. 5C and 5D, the switches in the firing circuit of FIG. 6B only correspond to a single VCSEL. For example, the first anode switch 628 associated with the first VCSEL 620 may be opened (along with the other anode switches 638, 648, 658) to allow the first capacitor 626 (along with the other capacitors 636, 646, 656) to charge during a charging stage. The first capacitor 626 may be charged from the voltage source node 614 through the inductor 612 and the first charging diode 621 during the charging stage. Thereafter, prior to any firing stage(s), the first anode switch 628 may be closed to discharge the first capacitor 626 to ground. In this way, the first capacitor 626 could be deselected for firing (i.e., the first VCSEL 620 would not be fired using the first capacitor 626 during subsequent firing stages). If the first anode switch 628 is not engaged prior to a firing stage, the first capacitor 626/first VCSEL 620 may, instead, have been selected for firing. Further, the first cathode switch 629 can be closed after a charging stage (e.g., if the first capacitor 626 was not discharged after the charging stage) to allow the first VCSEL 620 to emit a light pulse. The closing of the first cathode switch 629 may occur during a firing stage, for example.

Charging and firing associated with the other VCSELs 630, 640, 650 may also be performed in a similar fashion to the charging/firing associated first VCSEL 620 described above. As with the example embodiments of FIGS. 5A-5D, the VCSELs 620, 630, 640, 650 may be fired sequentially. Also similar to above, the anode switches 628, 638, 648, 658 and/or the cathode switches 629, 639, 649, 659 may correspond to transistors (e.g., FETs, such as GaNFETs, or BJTs), microelectromechanical systems (MEMS) switches, vacuum tubes, etc.

Regardless of which of the array arrangements and firing circuit arrangements of FIGS. 5A-6B are used, light pulses emitted by the VCSELs of the array may be reflected by one or more objects in the environment surrounding the lidar device and redirected toward the lidar device. These reflections may then be detected by a plurality of detectors (e.g., within a detector array) in the lidar device. For example, the reflections may be detected by the light detectors 426 illustrated and described with reference to FIG. 4B. In some embodiments, the plurality of detectors may be a SPAD array (e.g., a SiPM) with a digital-layout integrated circuit. Additionally or alternatively, in some embodiments, the plurality of detectors may be physically separated from the VCSELs (e.g., rather than being coaxial or adjacent to the VCSELs within the lidar device, they may be located in a different portion of the lidar device entirely). This separation may allow an imaging plane used by the detectors within the lidar device to be different from the emission plane used by the VCSELs in the lidar device. This may correspond to a bicentric system. Because of this, one optic (e.g., a transmit lens) or one portion of an optic (e.g., a first portion of a shared lens) may be used to optically modify light pulses emitted by the VCSELs and a different optic (e.g., a receive lens) or a different portion of the same optic (e.g., a second portion of the shared lens) may be used to optically modify the reflected light pulses before the reflections reach the plurality of detectors. In this way, transmit light and receive light can be modified differently.

As stated above, a plurality of detectors could be used to detect reflections of the light signals emitted by the VCSELs. In such an arrangement, there may be a one-to-one correspondence between VCSELs and detectors (i.e., each detector is arranged to receive reflections of light signals emitted by a particular VCSEL). Alternatively, each of the detectors could be arranged to detect reflections of light signals emitted by multiple VCSELs, or multiple detectors could be arranged to detect reflections of light signals emitted by a particular VCSEL. For example, there could be multiple detection regions on a single detector used to detect reflections of light signals from different VCSELs. Additionally or alternatively, a single detector could move relative to the VCSELs such that the detector can detect reflections of light signals from different VCSELs at different times.

Figure 7:
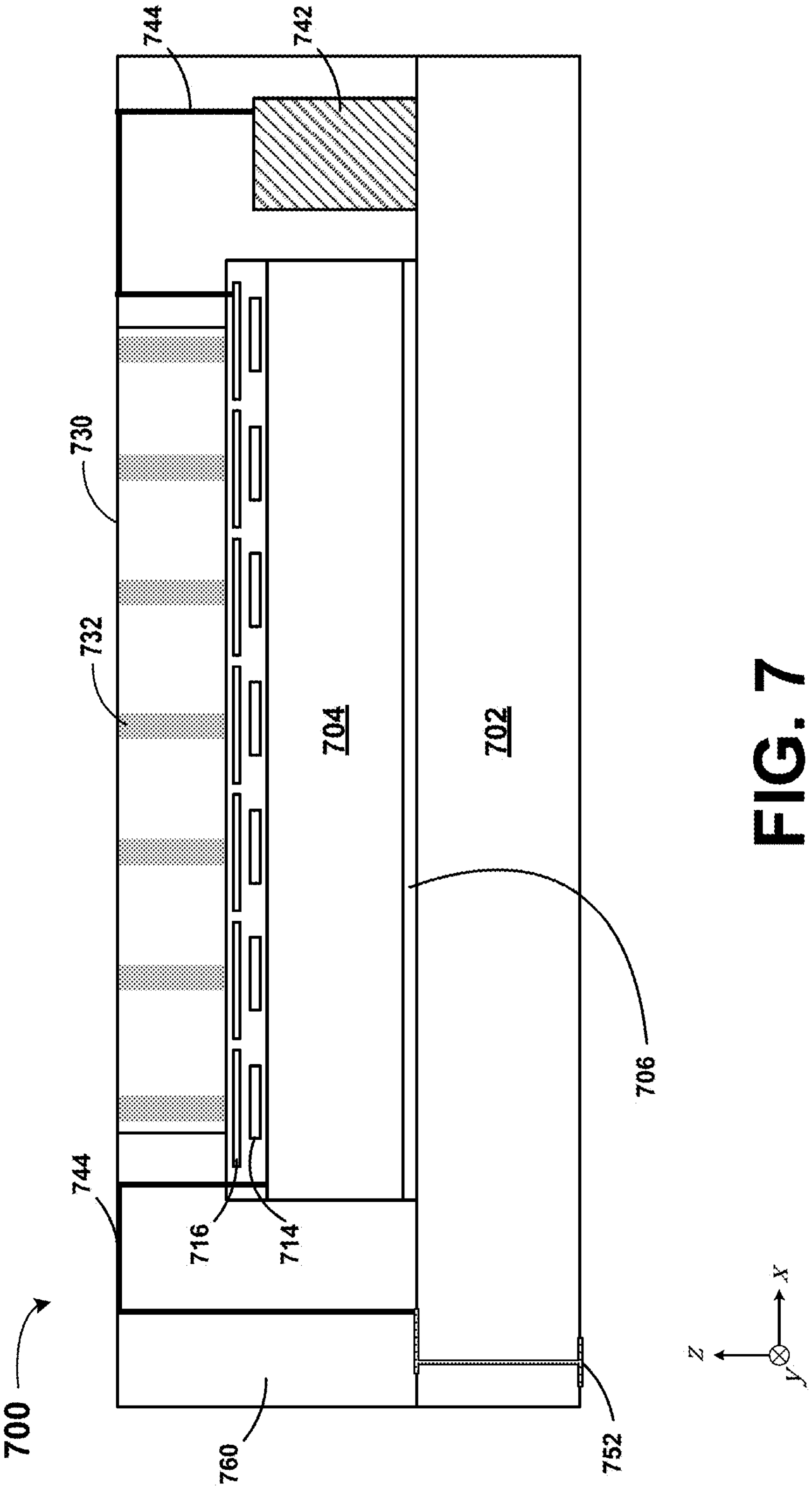
FIG. 7 is a cross-sectional side-view illustration of an emitter subsystem of a lidar device, according to example embodiments.

FIG. 7 is a cross-sectional side-view illustration of an emitter subsystem 700 of a lidar device, according to example embodiments. The emitter subsystem 700 may be the result of a method of fabricating an array of VCSELs and attaching components to the VCSELs (e.g., the controller), such that the array of VCSELs can be integrated with and used by a lidar device. The emitter subsystem 700 includes a mounting structure 702, a driver 704 affixed to the mounting structure 702 using a bonding agent 706, an anode fanout 714, a cathode fanout 716, an array of VCSELs 730 (including individual VCSELs 732 defined within the structure), a capacitor 742 connected to the cathode fanout 716 using a metallic trace 744, a reflow pad 752, and an encapsulating epoxy structure 760.

The VCSELs 732 illustrated in the array 730 of FIG. 7 are bottom-emitting VCSELs (e.g., based on the location of the anode fanout 714 and the cathode fanout 716). In other words, the VCSELs 732 illustrated in FIG. 7 may emit light pulses in the positive z-direction.

The mounting structure 702 may be used during fabrication of the emitter subsystem 700 (e.g., may provide attachment points for other components). In some embodiments, the mounting structure 702 may be a polyimide PCB substrate or other PCB substrate (e.g., a rigid PCB, a ceramic PCB, or a glass PCB). Further, in some embodiments, portions of the mounting structure 702 (e.g., the entirety of the mounting structure 702) may be removed from the emitter subsystem 700.

The driver 704 may, in various embodiments, include the controller and/or portions of the firing circuit. For example, the driver 704 may include some of the switches illustrated in FIG. 6B as part of the firing circuit (e.g., the anode switches 628, 638, 648, 658 and/or the cathode switches 629, 639, 649, 659). The driver 704 may be a silicon (Si) driver that includes an application-specific integrated circuit (ASIC), for example. Further, the driver 704 may be connected to the anode fanout 714 and/or cathode fanout 716 to allow for firing the VCSELs 732 in the array 730.

As illustrated, the driver 704 may be adhered to the mounting structure 702 using a bonding agent 706. In some embodiments, the bonding agent 706 may have been formed using epoxy die-bonding.

The capacitor 742 illustrated in FIG. 7 may represent one of many capacitors (e.g., with other capacitors oriented along the y-axis behind the capacitor 742) used to fire the VCSELs 732. For example, there may be a separate capacitor associated with each of the VCSELs 732 in the array 730, similar to the array 600 illustrated in FIGS. 6A and 6B. Alternatively, in some embodiments, there may be a single capacitor or capacitor bank used to fire all the VCSELs 732 (e.g., similar to the firing circuit embodiment illustrated in FIG. 5D).

The capacitor 742 illustrated in FIG. 7 may be implemented as a surface-mounted device (SMD). Also as illustrated, the capacitor 742 is connected to the cathode fanout 716 using a metallic trace 744. The metallic trace 744 may include a plated metal. Further, this metallic trace 744 may include a surface trace (e.g., through the encapsulating epoxy structure 760) and/or a trace through one or more vias (e.g., laser-cut vias through the encapsulating epoxy structure 760). Additionally or alternatively, the capacitor(s) could be connected to the anode fanout 714, depending on the firing circuit structure used. Also as illustrated, the encapsulating epoxy structure 760 may assist in keeping the array 730, the driver 704 (e.g., including the firing circuit and/or the controller), and/or the capacitor 742 adhered to the mounting structure 702.

While not illustrated in FIG. 7, it is understood that one or more heating or cooling elements may be present in the emitter subsystem 700. Such heating or cooling elements may assist in maintaining the VCSELs 732 at a predetermined and/or stable temperature (e.g., in order to control emission characteristics of the VSCELs 732). The heating or cooling elements may be controlled (e.g., by a controller) based on an ambient temperature in the surrounding environment (e.g., as measured by a temperature sensor).

Further, while an array of discrete VCSELs is described throughout this disclosure, it is understood that alternative arrangements are also possible and are contemplated herein. For example, one or more VCSELs pictured (e.g., in FIG. 5A, 6A, 7, etc.) could instead be replaced by an array of VCSELs. In other words, an emitter subsystem as described herein may include an array made up of small arrays of VCSELs. Such arrangements may be used to provide redundancy (e.g., in case of failure of one or more individual VCSELs), to enhance resolution, and/or to enhance brightness, in various embodiments.

It is understood that other firing circuits are also possible and contemplated herein. FIGS. 8A-8G are schematic illustrations of possible alternative firing circuits that may be used to cause one or more VCSELs of a lidar device to emit light.

Figure 8A:
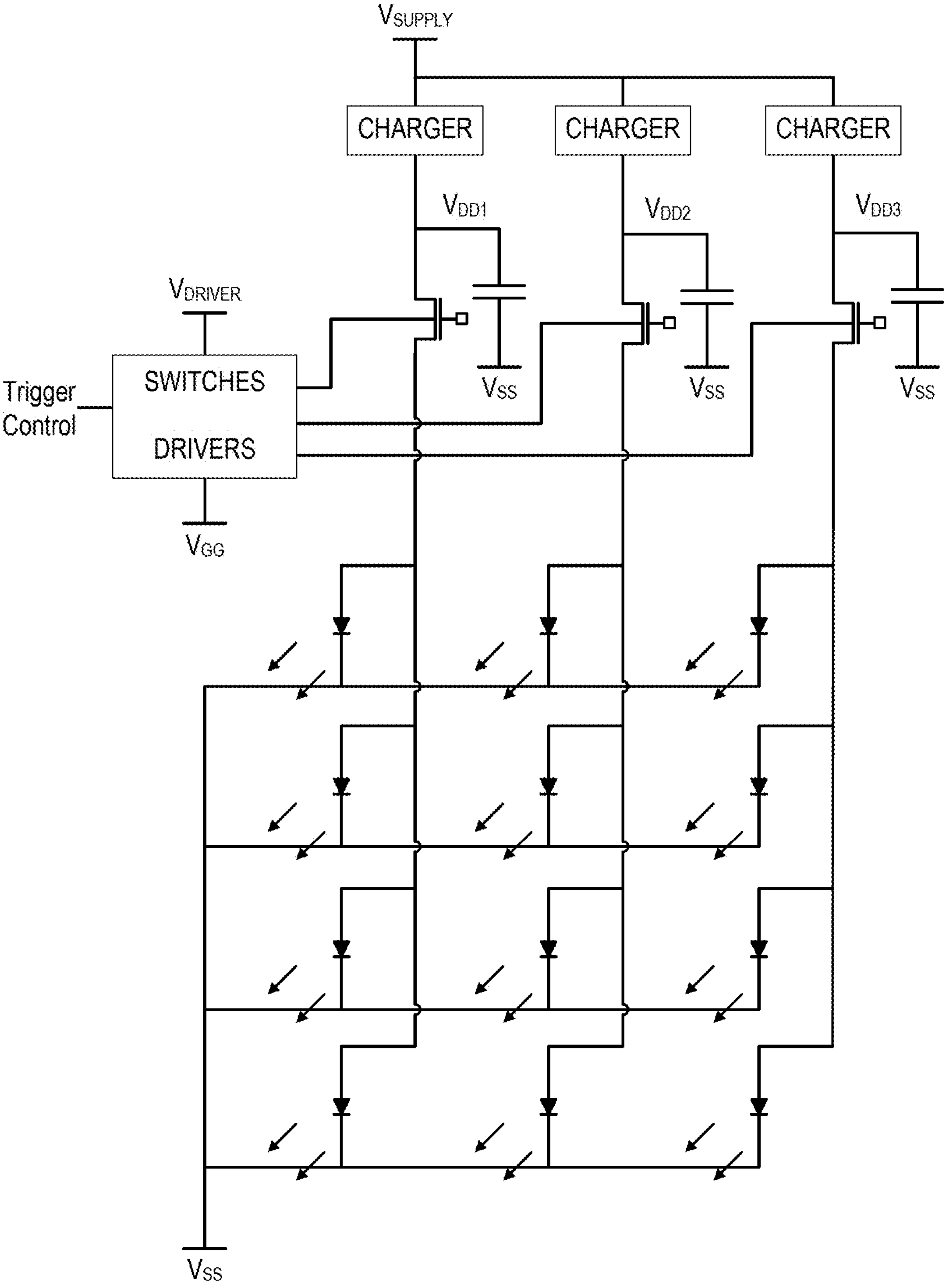
FIG. 8A is a schematic illustration of a firing circuit, according to example embodiments.

FIG. 8A illustrates a firing circuit having anodes oriented along the columns of VCSELs and cathodes oriented along the rows of VCSELs. This arrangement may enable all the VCSELs in a given column to be fired simultaneously. The voltages used to power the VCSELs in the different columns may be the same as one another or different from one another, in various embodiments. While a limited number of rows and columns of VCSELs are illustrated, it is understood that other numbers of rows, other numbers of columns, and/or other numbers of VCSELs could be implemented and that such embodiments are contemplated herein.

Figure 8B:
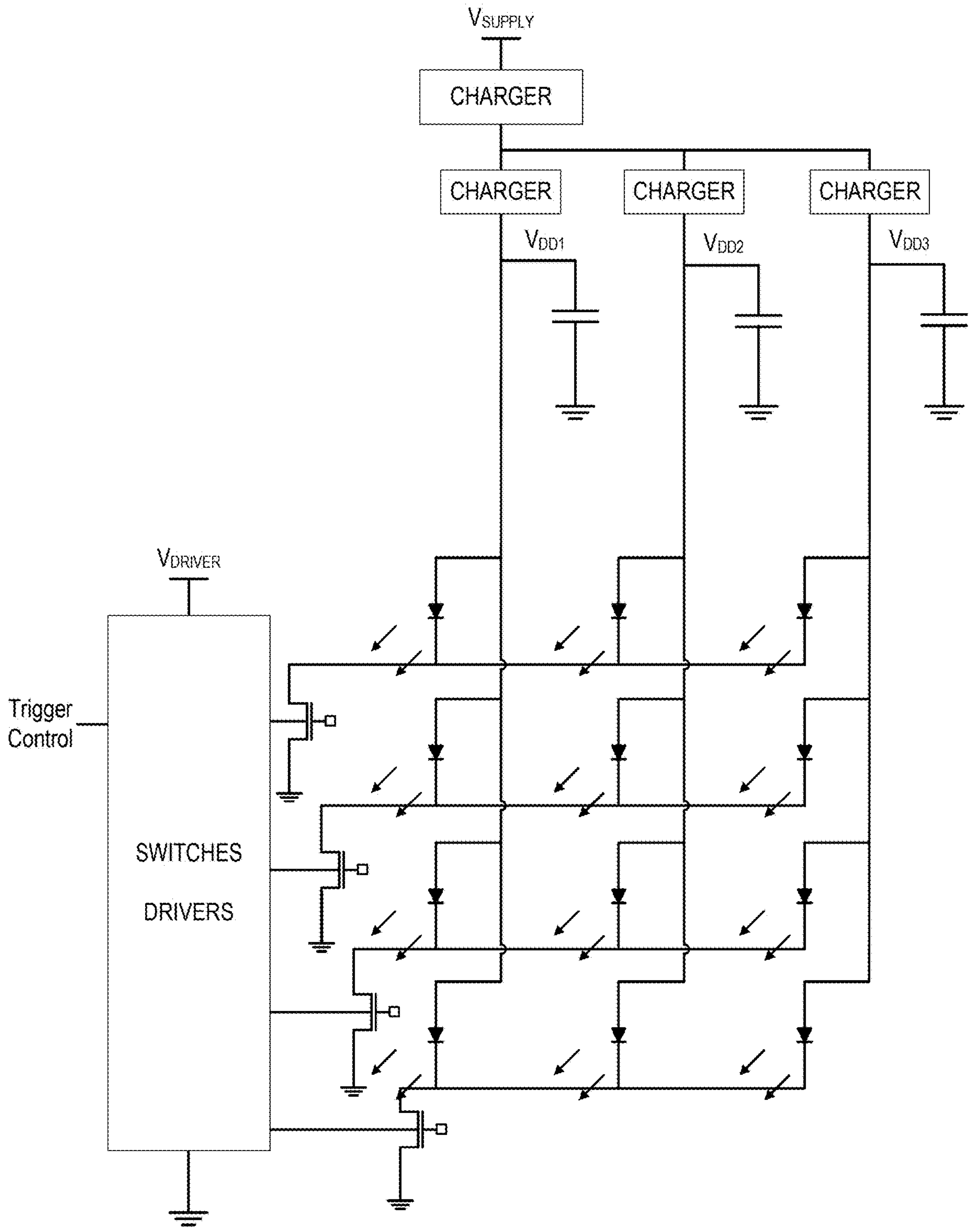
FIG. 8B is a schematic illustration of a firing circuit, according to example embodiments.

FIG. 8B illustrates a firing circuit having anodes oriented along the columns of VCSELs and cathodes oriented along the rows of VCSELs. This arrangement may enable all the VCSELs in a given row to be fired simultaneously. While a limited number of rows and columns of VCSELs are illustrated, it is understood that other numbers of rows, other numbers of columns, and/or other numbers of VCSELs could be implemented and that such embodiments are contemplated herein.

Figure 8C:
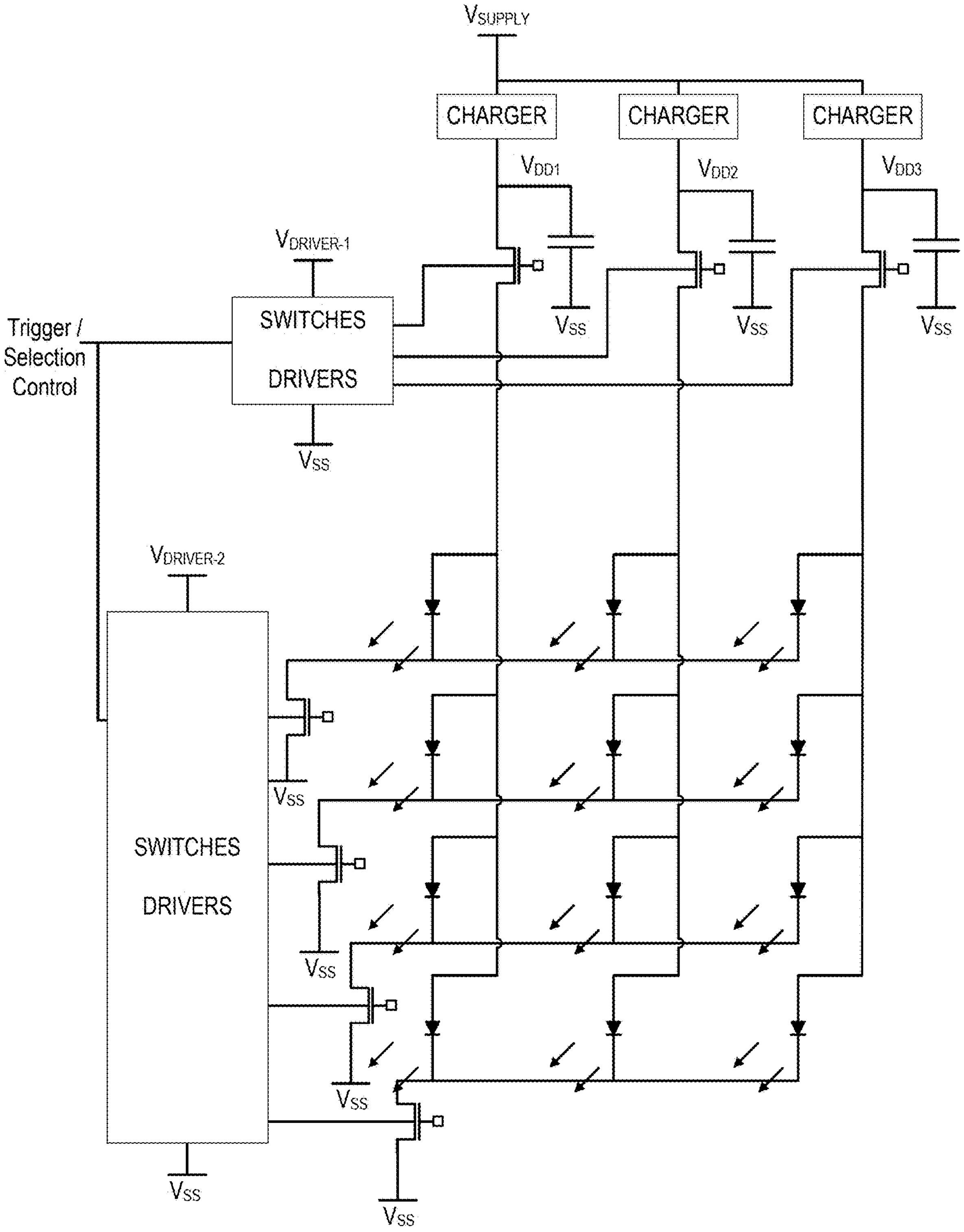
FIG. 8C is a schematic illustration of a firing circuit, according to example embodiments.

FIG. 8C illustrates a firing circuit having anodes oriented along the columns of VCSELs and cathodes oriented along the rows of VCSELs. This arrangement may enable any of the VCSELs in the array to be fired individually. While a limited number of rows and columns of VCSELs are illustrated, it is understood that other numbers of rows, other numbers of columns, and/or other numbers of VCSELs could be implemented and that such embodiments are contemplated herein.

Figure 8D:
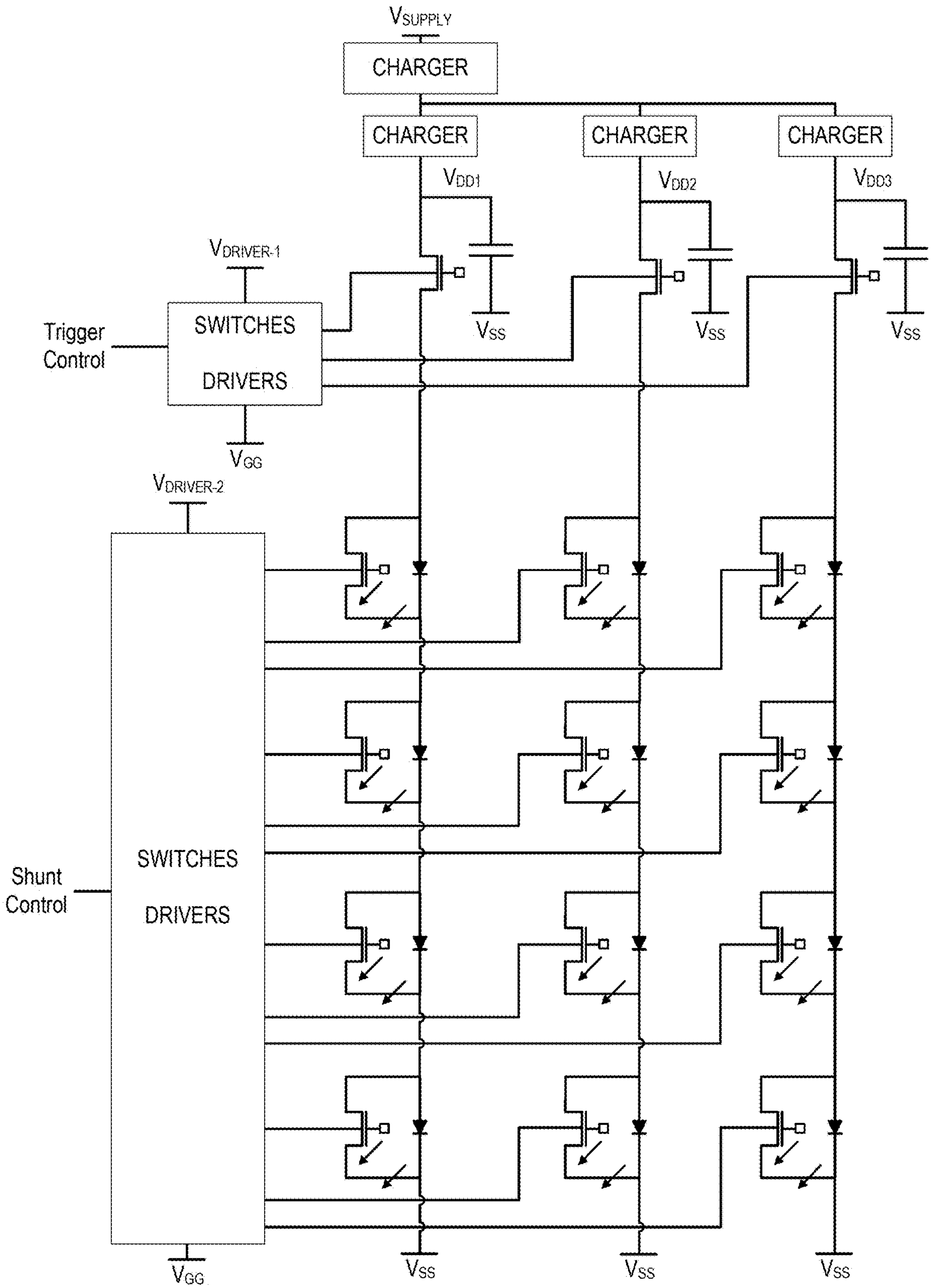
FIG. 8D is a schematic illustration of a firing circuit, according to example embodiments.

FIG. 8D illustrates an array of VCSELs where the VCSELs in any given column are connected in series with one another. Also, each of the VCSELs in FIG. 8D include a shunt switch connected in parallel with the VCSEL that could be activated to short a given VCSEL and prevent that VCSEL from firing (e.g., during a firing stage). This arrangement may enable any of the VCSELs in the array to be fired individually.

FIGS. 8A-8D show a supply voltage ($V_{SUPPLY}$) and one or more associated charger circuits (CHARGER). As illustrated in FIGS. 8A-8D, the supply voltage may be shared between the anodes of all the VCSELs in each of the columns of the array. Similarly, in some embodiments as illustrated in FIGS. 8B and 8D, one of the charger circuits may be shared between the anodes of all the VCSELs in each of the columns of the array. However, it is understood that other arrangements are also possible and are contemplated herein. For example, each column may have a corresponding supply voltage and/or a corresponding associated charger circuit. In some embodiments, the supply voltage and/or associated charger circuit may be different from one column to the next.

Further, FIGS. 8A-8D show that the supply voltage ($V_{SUPPLY}$) may be used to control the voltages at terminals of capacitors for columns of VCSELs. For example, the supply voltage ($V_{SUPPLY}$) may be used to set $V_{DD1}$, $V_{DD2}$, and $V_{DD3}$. As illustrated by the respective CHARGERs for each column that separate the supply voltage ($V_{SUPPLY}$) and $V_{DD1}$, $V_{DD2}$, and $V_{DD3}$, each of the respective capacitor voltages ($V_{DD1}$, $V_{DD2}$, and $V_{DD3}$) may be separately controlled (e.g., using a voltage step-up or step-down, represented by the CHARGERs). Hence, in some embodiments, each of the respective capacitor voltages ($V_{DD1}$, $V_{DD2}$, and $V_{DD3}$) may be different from one another. This may enable different types of VCSELs to be used in different columns or enable different emission intensity for VCSELs in different columns. It is understood, though, that this is provided solely as an example and that other embodiments are also possible. For example, in some embodiments there may be no voltage control for some or all of the capacitor voltages relative to the supply voltage (e.g., $V_{SUPPLY}=V_{DD1}=$VDD2$=V_{DD3}$). Other relative voltages between $V_{SUPPLY}$, $V_{DD1}$, $V_{DD2}$, and $V_{DD3}$ are also possible and are contemplated herein.

Figure 8E:
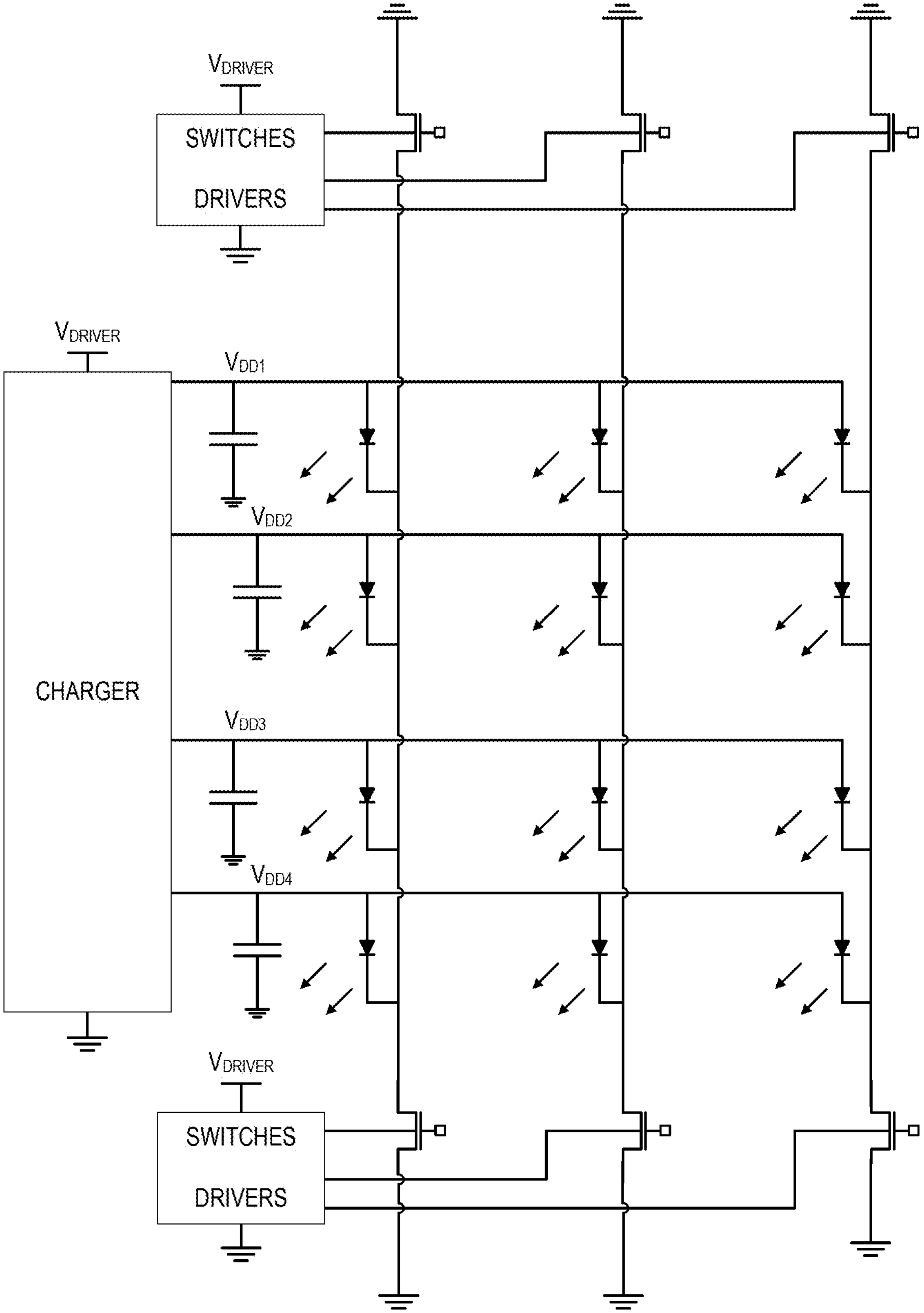
FIG. 8E is a schematic illustration of a firing circuit, according to example embodiments.

FIG. 8E illustrates a firing circuit having anodes oriented along the rows of VCSELs and cathodes oriented along the columns of VCSELs. This arrangement may enable all the VCSELs in a given column to be fired simultaneously. As illustrated, columns of VCSELs could be split into an upper half and a lower half where the upper and lower halves are controlled by different switches/drivers. Such an arrangement may limit the maximum inductance along the discharge path (e.g., thereby limiting power loss in the circuit). While a limited number of rows and columns of VCSELs are illustrated, it is understood that other numbers of rows, other numbers of columns, and/or other numbers of VCSELs could be implemented and that such embodiments are contemplated herein.

Figure 8F:
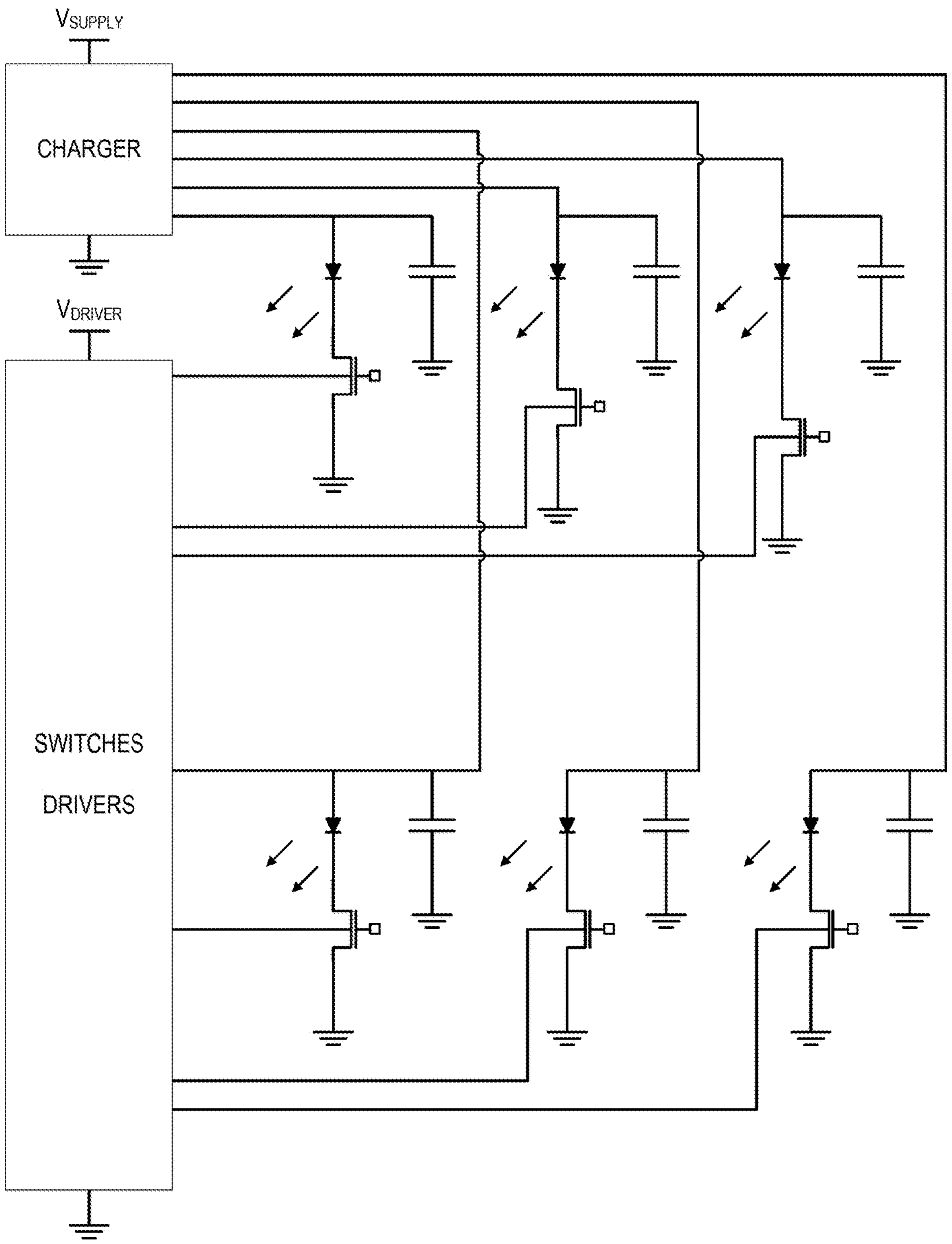
FIG. 8F is a schematic illustration of a firing circuit, according to example embodiments.

FIG. 8F illustrates a firing circuit where each VCSEL in the array has a separate capacitor and associated switch. This arrangement may enable any of the VCSELs in the array to be fired individually. While a limited number of rows and columns of VCSELs are illustrated, it is understood that other numbers of rows, other numbers of columns, and/or other numbers of VCSELs could be implemented and that such embodiments are contemplated herein.

Figure 8G:
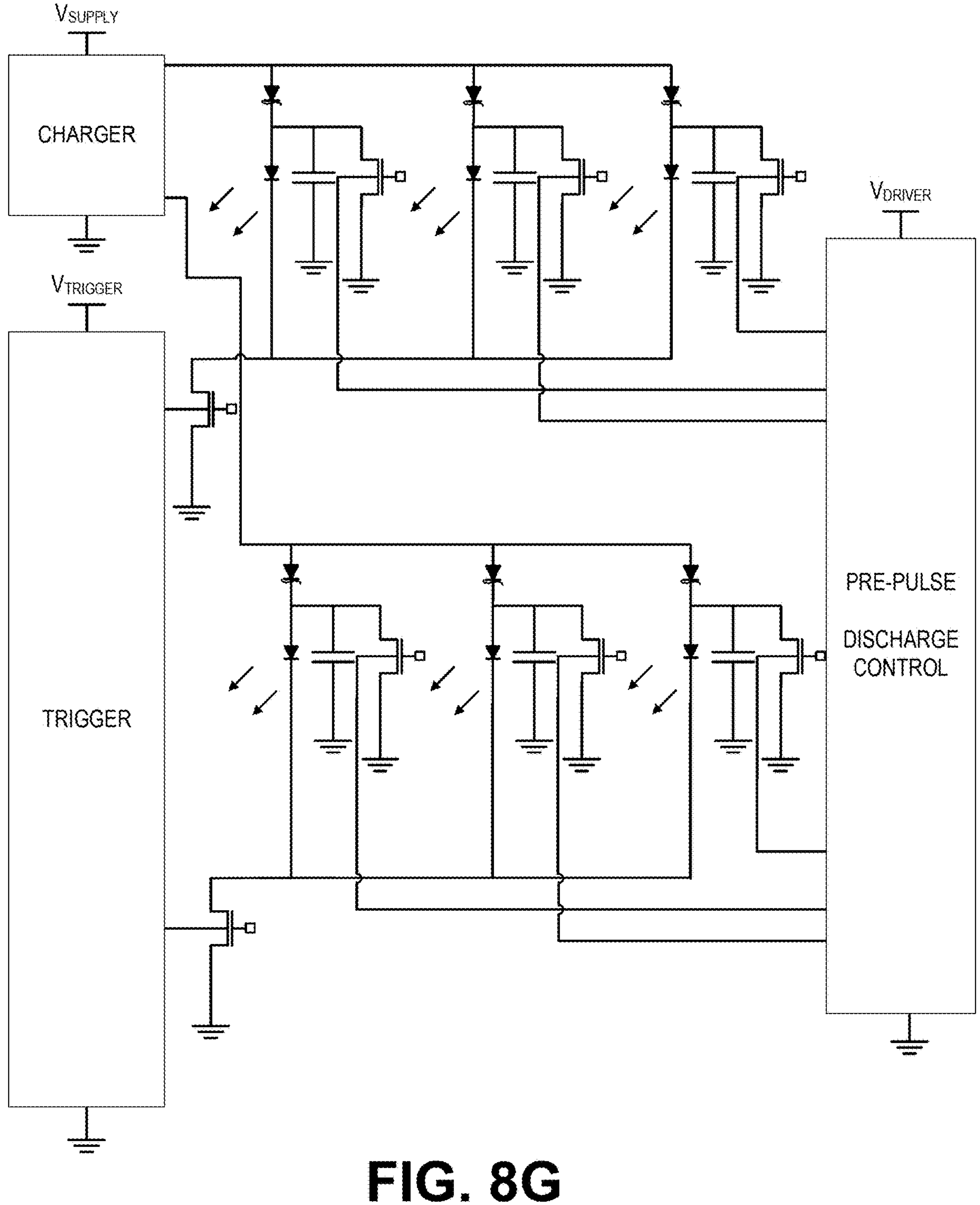
FIG. 8G is a schematic illustration of a firing circuit, according to example embodiments.

FIG. 8G illustrates a firing circuit where each cathode in each row of VCSELs in the array are shorted to one another. In such an embodiment, VCSELs may be charged in parallel to one another and/or caused to emit light in parallel to one another. Further, as illustrated in FIG. 8G, Schottky diodes may be included to decouple the capacitors within each row. While a limited number of rows and columns of VCSELs are illustrated, it is understood that other numbers of rows, other numbers of columns, and/or other numbers of VCSELs could be implemented and that such embodiments are contemplated herein.

Figure 8H:
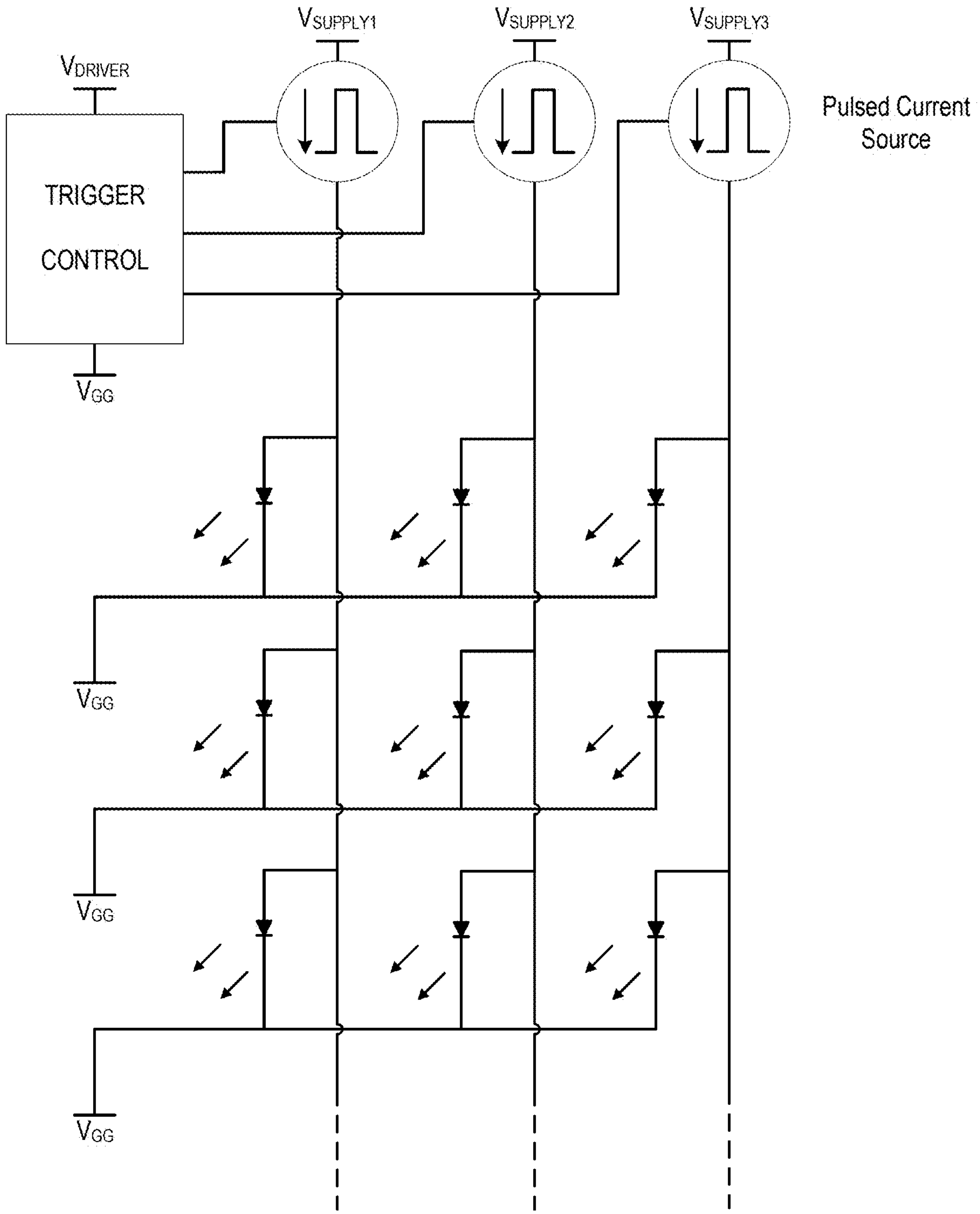
FIG. 8H is a schematic illustration of a firing circuit, according to example embodiments.

FIG. 8H illustrates a firing circuit having anodes of VCSELs within a given row connected to one another and cathodes within a given column of VCSELs connected to one another. As illustrated, separate pulsed current sources may be connected to each column. In alternate embodiments, the pulsed current sources could be connected on the bottom of the diagram (e.g., connected to the cathodes of each VCSEL rather than the anodes. While a limited number of rows and columns of VCSELs are illustrated, it is understood that other numbers of rows, other numbers of columns, and/or other numbers of VCSELs could be implemented and that such embodiments are contemplated herein.

Figure 9:
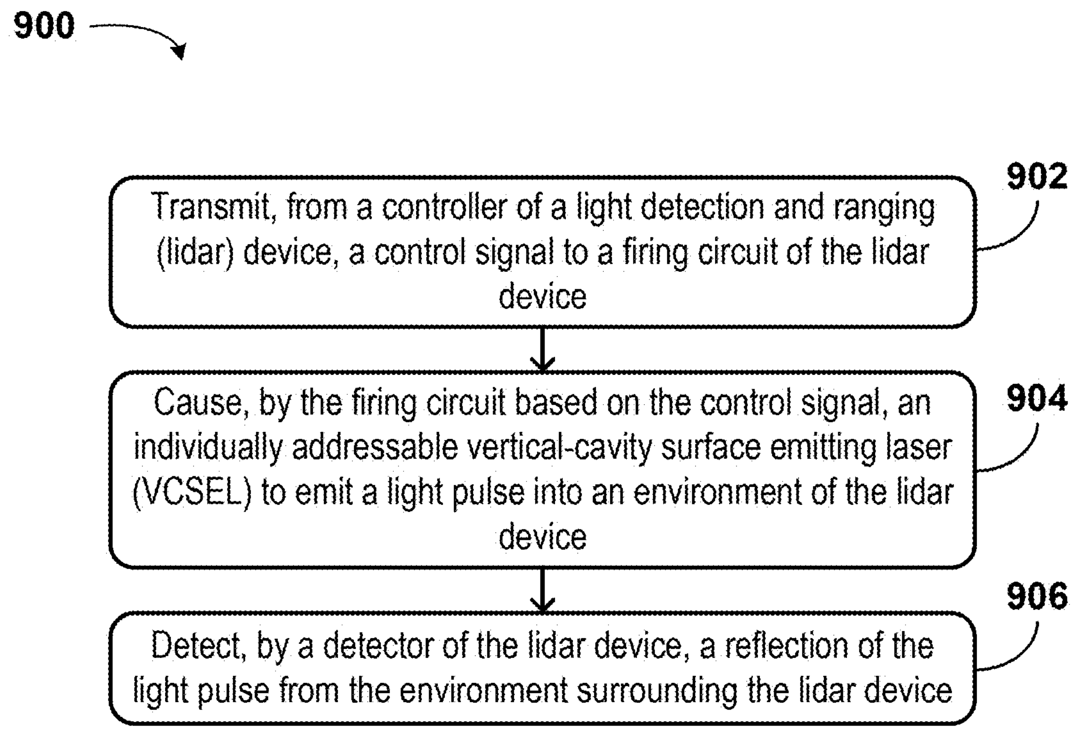
FIG. 9 is a flowchart illustration of a method, according to example embodiments.

FIG. 9 is a flowchart diagram of a method 900, according to example embodiments. The method 900 may be performed by a lidar device (e.g., the lidar unit 128 illustrated in FIG. 1, the first lidar unit 204 illustrated in FIGS. 2A-3, the second lidar unit 206 illustrated in FIGS. 2A-2E, or the lidar device 410 illustrated in FIGS. 4A and 4B). Such a lidar device may include an array of VCSELs (e.g., the array of VCSELs 500 illustrated in FIGS. 5A and 5B), for example.

At block 902, the method 900 may include transmitting, from a controller of a light detection and ranging (lidar) device, a control signal to a firing circuit of the lidar device. The control signal may provide a charging time and/or charging current used to charge one or more capacitors of the firing circuit. Additionally, the control signal may be transmitted by the controller at regular intervals (e.g., every 1 ms, every 5 ms, every 10 ms, etc.) or at irregular intervals in response to one or more measurements of a surrounding scene (e.g., based on a determined region of interest).

At block 904, the method 900 may include causing, by the firing circuit based on the control signal, an individually addressable vertical-cavity surface emitting laser (VCSEL) to emit a light pulse into a surrounding environment of the lidar device. The individually addressable VCSEL is one of a plurality of individually addressable VCSELs within an array.

At block 906, the method 900 may include detecting, by a detector of the lidar device, a reflection of the light pulse from the environment surrounding the lidar device. The detector is one of a plurality of detectors of the lidar device.

It is understood that the VCSELs described throughout the description could be fabricated by a variety of manufacturing techniques, each of which is contemplated herein. For example, one or more photolithography steps (e.g., applying a spin-coated photoresist, exposing the photoresist to an ultraviolet light, etc.), cutting/etching steps (e.g., chemical etches or laser cuts), doping steps (e.g., ion-implantation steps), deposition steps (e.g., metal-deposition steps or epitaxy steps), and/or adhering steps (e.g., adhering one or more components to a PCB using epoxy) could be employed to fabricate one or more of the VCSELs. Further, the VCSELs may be fabricated from a variety of materials (e.g., Si, GaAs, AlGaAs, InGaAs, etc.). The selection of materials for fabrication may be based on a desired wavelength output and/or desired power output of the VCSELs (e.g., based on a target range within a run-time environment of the associated lidar device). Other manufacturing techniques are also possible.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the message flow diagrams, scenarios, and flow charts in the figures and as discussed herein, each step, block, operation, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step, block, or operation that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical operations or actions in the method or technique. The program code and/or related data can be stored on any type of computer-readable medium such as a storage device including RAM, a disk drive, a solid state drive, or another storage medium.

Moreover, a step, block, or operation that represents one or more information transmissions can correspond to information transmissions between software and/or hardware modules in the same physical device. However, other information transmissions can be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A system comprising:

a mounting structure;

a driver affixed to the mounting structure;

an array of vertical-cavity service-emitting lasers (VCSELs) connected to an anode fanout and a cathode fanout, wherein the driver comprises a firing circuit configured to cause one or more of the VCSELs to emit light using the anode fanout and the cathode fanout, wherein the VCSELs of the array of VCSELs are arranged in a hexagonal pattern, and wherein the hexagonal pattern is sparse in comparison to sizes of emission surfaces of the VCSELs;

one or more capacitors adhered to the mounting structure and connected to the cathode fanout or the anode fanout, wherein the one or more capacitors are configured to provide energy to the array of VCSELs; and an epoxy structure that encapsulates (i) the mounting structure and (ii) the array of VCSELs, the driver, or the one or more capacitors.

2. The system of claim 1, wherein the VCSELs are bottom-emitting VCSELs.

3. The system of claim 1, wherein the mounting structure comprises a polyimide printed circuit board (PCB), a rigid PCB, a ceramic PCB, or a glass PCB.

4. The system of claim 1, wherein the driver comprises one or more anode switches connected to the anode fanout or one or more cathode switches connected to the cathode fanout.

5. The system of claim 1, wherein the driver comprises a silicon driver that includes an application-specific integrated circuit (ASIC).

6. The system of claim 1, wherein the driver is affixed to the mounting structure using a bonding agent, and wherein the bonding agent comprises an epoxy die-bond.

7. The system of claim 1, wherein the driver comprises one or more anode switches or one or more cathode switches.

8. The system of claim 1, wherein the one or more capacitors are connected to the cathode fanout using a metallic trace.

9. The system of claim 8, wherein the metallic trace comprises a plated metal.

10. The system of claim 8, wherein the metallic trace comprises a surface trace through the encapsulating epoxy structure or a laser-cut via through the encapsulating epoxy structure.

11. The system of claim 1, wherein the one or more capacitors comprise a surface-mounted device (SMD).

12. The system of claim 1, wherein the one or more capacitors comprise a bank of capacitors.

13. The system of claim 12, wherein each capacitor is configured to provide energy to a separate VCSEL in the array of VCSELs.

14. The system of claim 12, wherein each capacitor is configured to provide energy to all VCSELs in the array of VCSELs.

15. The system of claim 1, further comprising one or more heating elements configured to maintain the array of VCSELs at a predetermined or stable temperature.

16. The system of claim 1, further comprising one or more cooling elements configured to maintain the array of VCSELs at a predetermined or stable temperature.

17. The system of claim 1, further comprising:

one or more heating elements or one or more cooling elements configured to maintain the array of VCSELs at a predetermined or stable temperature; and a controller configured to control the one or more heating elements or the one or more cooling elements based on an ambient temperature in a surrounding environment.

18. The system of claim 17, wherein the controller comprises a temperature sensor configured to measure the ambient temperature in the surrounding environment.

19. A method comprising:

affixing a driver to a mounting structure;

connecting an array of vertical-cavity service-emitting lasers (VCSELs) to an anode fanout and a cathode fanout, wherein the driver comprises a firing circuit configured to cause one or more of the VCSELs to emit light using the anode fanout and the cathode fanout, wherein the VCSELs of the array of VCSELs are arranged in a hexagonal pattern, wherein the hexagonal pattern is sparse in comparison to sizes of emission surfaces of the VCSELs;

adhering one or more capacitors to the mounting structure;

connecting the one or more capacitors to the cathode fanout or the anode fanout, wherein the one or more capacitors are configured to provide energy to the array of VCSELs;

and encapsulating (i) the mounting structure and (ii) the array of VCSELs, the driver, or the one or more capacitors using an epoxy structure.

20. A method comprising:

causing, by a firing circuit of a driver, one or more vertical-cavity service-emitting lasers (VCSELs) within an array of VCSELs to emit light using an anode fanout and a cathode fanout, wherein the array of VCSELs is connected to the anode fanout and the cathode fanout, wherein the VCSELs of the array of VCSELs are arranged in a hexagonal pattern, wherein the hexagonal pattern is sparse in comparison to sizes of emission surfaces of the VCSELs, and wherein the driver is affixed to a mounting structure; and providing, by one or more capacitors adhered to the mounting structure and connected to the cathode fanout or the anode fanout, energy to the array of VCSELs, wherein an epoxy structure encapsulates (i) the mounting structure and (ii) the array of VCSELs, the driver, or the one or more capacitors.

* * * * *